United States Patent
Yamamuro et al.

(10) Patent No.: US 12,179,340 B2
(45) Date of Patent: Dec. 31, 2024

(54) WORK HEAD AND WORK MACHINE

(71) Applicant: FUJI CORPORATION, Chiryu (JP)

(72) Inventors: Junichi Yamamuro, Chiryu (JP); Hideki Hashimoto, Miyoshi (JP)

(73) Assignee: FUJI CORPORATION, Chiryu (JP)

( * ) Notice: Subject to any disclaimer, the term of this patent is extended or adjusted under 35 U.S.C. 154(b) by 764 days.

(21) Appl. No.: 17/418,650

(22) PCT Filed: Dec. 28, 2018

(86) PCT No.: PCT/JP2018/048455
§ 371 (c)(1),
(2) Date: Jun. 25, 2021

(87) PCT Pub. No.: WO2020/136869
PCT Pub. Date: Jul. 2, 2020

(65) Prior Publication Data
US 2022/0072720 A1    Mar. 10, 2022

(51) Int. Cl.
*B25J 15/08* (2006.01)
*B25J 9/14* (2006.01)
*B25J 15/00* (2006.01)
*B25J 15/02* (2006.01)
*H05K 13/04* (2006.01)

(52) U.S. Cl.
CPC ............... *B25J 15/08* (2013.01); *B25J 9/14* (2013.01); *B25J 15/0033* (2013.01); *B25J 15/0293* (2013.01); *H05K 13/0404* (2013.01)

(58) Field of Classification Search
CPC .... B25J 15/08; B25J 15/0475; B25J 15/0408; B25J 9/14; B25J 15/0293; B25J 15/0033; H05K 13/0404
USPC .................................................. 294/213, 86.4
See application file for complete search history.

(56) References Cited

U.S. PATENT DOCUMENTS

| | | | | |
|---|---|---|---|---|
| 5,050,919 A | * | 9/1991 | Yakou | B25J 15/0475 294/185 |
| 5,529,359 A | * | 6/1996 | Borcea | B25J 15/0253 294/207 |
| 5,562,320 A | * | 10/1996 | Bloomberg | B25J 15/0253 294/902 |

(Continued)

FOREIGN PATENT DOCUMENTS

| | | |
|---|---|---|
| JP | 63-236400 A | 10/1988 |
| JP | 4-83399 A | 3/1992 |

(Continued)

OTHER PUBLICATIONS

International Search Report mailed on Feb. 19, 2019 in PCT/JP2018/048455 filed on Dec. 28, 2018 (2 pages).

*Primary Examiner* — Paul T Chin
(74) *Attorney, Agent, or Firm* — Oblon, McClelland, Maier & Neustadt, L.L.P.

(57) ABSTRACT

A work head including a head main body, multiple movable bodies held to be approachable to or separatable from each other by the head main body, and an air passage formed, being open between the multiple movable bodies, in the head main body, in which by gripping a holding tool configured to hold a component by approach of the multiple movable bodies, the holding tool communicates with the air passage and holds the component by supply of air to the holding tool via the air passage.

5 Claims, 23 Drawing Sheets

(56) References Cited

U.S. PATENT DOCUMENTS

| | | | | |
|---|---|---|---|---|
| 6,015,174 | A * | 1/2000 | Raes | B25J 15/0253 |
| | | | | 294/185 |
| 6,273,485 | B1 * | 8/2001 | Maffeis | B25B 5/061 |
| | | | | 294/207 |
| 7,635,154 | B2 * | 12/2009 | Maffeis | B25J 15/0266 |
| | | | | 294/207 |
| 10,870,206 | B2 * | 12/2020 | Hara | B25J 15/0253 |
| 10,875,195 | B2 * | 12/2020 | Zitting | B25J 15/0023 |
| 2002/0070571 | A1 * | 6/2002 | Kim | B25J 15/028 |
| | | | | 294/207 |
| 2015/0237773 | A1 | 8/2015 | Nishiyama | |
| 2018/0255670 | A1 | 9/2018 | Watanabe et al. | |
| 2021/0178609 | A1 * | 6/2021 | Norton | B25J 15/0433 |

FOREIGN PATENT DOCUMENTS

| | | |
|---|---|---|
| JP | 2000-124679 A | 4/2000 |
| JP | 2006-319168 A | 11/2006 |
| JP | 2009-200532 A | 9/2009 |
| JP | 2018-148046 A | 9/2018 |
| WO | WO 2014/033900 A1 | 3/2014 |

* cited by examiner

WORK HEAD AND WORK MACHINE

TECHNICAL FIELD

The present disclosure relates to a work head that holds a component, and a work machine including the work head.

BACKGROUND ART

As the work machine, there is a work machine that holds a component by a work head and performs a mounting work of the held component. Patent Literature 1 below discloses such a work head and a work machine.

PATENT LITERATURE

Patent Literature 1: JP-A-H4-083399

BRIEF SUMMARY

Technical Problem

In the work head and the work machine which have the above configuration, it is desired to preferably hold the component. The present disclosure has been made in view of such circumstances, and is to more preferably hold a component by a work head.

Solution to Problem

In order to solve the problems, the present description discloses a work head including a head main body, multiple movable bodies held to be approachable to or separatable from each other by the head main body, and an air passage formed, being open between the multiple movable bodies, in the head main body, in which the work head grips a holding tool, being configured to hold a component, by causing the multiple movable bodies to approach the holding tool to be communicated with the air passage, so that the holding tool holds the component by air supplied thereto via the air passage.

Further, the present description discloses a work machine including the work head, a moving device configured to move the work head, a control device configured to control operation of the moving device, and an accommodation section configured to accommodate the claws, in which the fixing mechanism includes an engaging body configured to move between an engaging position with the claws and a disengaging position from the claws, and is configured to fix the claws by engagement of the engaging body with the claws and separate the claws by disengagement, and by controlling the operation of the moving device by the control device such that the engaging body abuts on an abutting section formed in the accommodation section in a state in which the claws are fixed to the movable bodies, the engaging body is moved from the engaging position with the claws to the disengaging position from the claws, the claws are separated from the movable bodies, and the claws are accommodated in the accommodation section.

Advantageous Effects

According to the present disclosure, the holding tool is mounted on the work head by being gripped by the multiple movable bodies. Therefore, the work head can preferably hold the component.

DESCRIPTION OF EMBODIMENTS

Hereinafter, as exemplary embodiments of the present disclosure, an embodiment of the present disclosure is described in detail with reference to the drawings.

Figure 1:
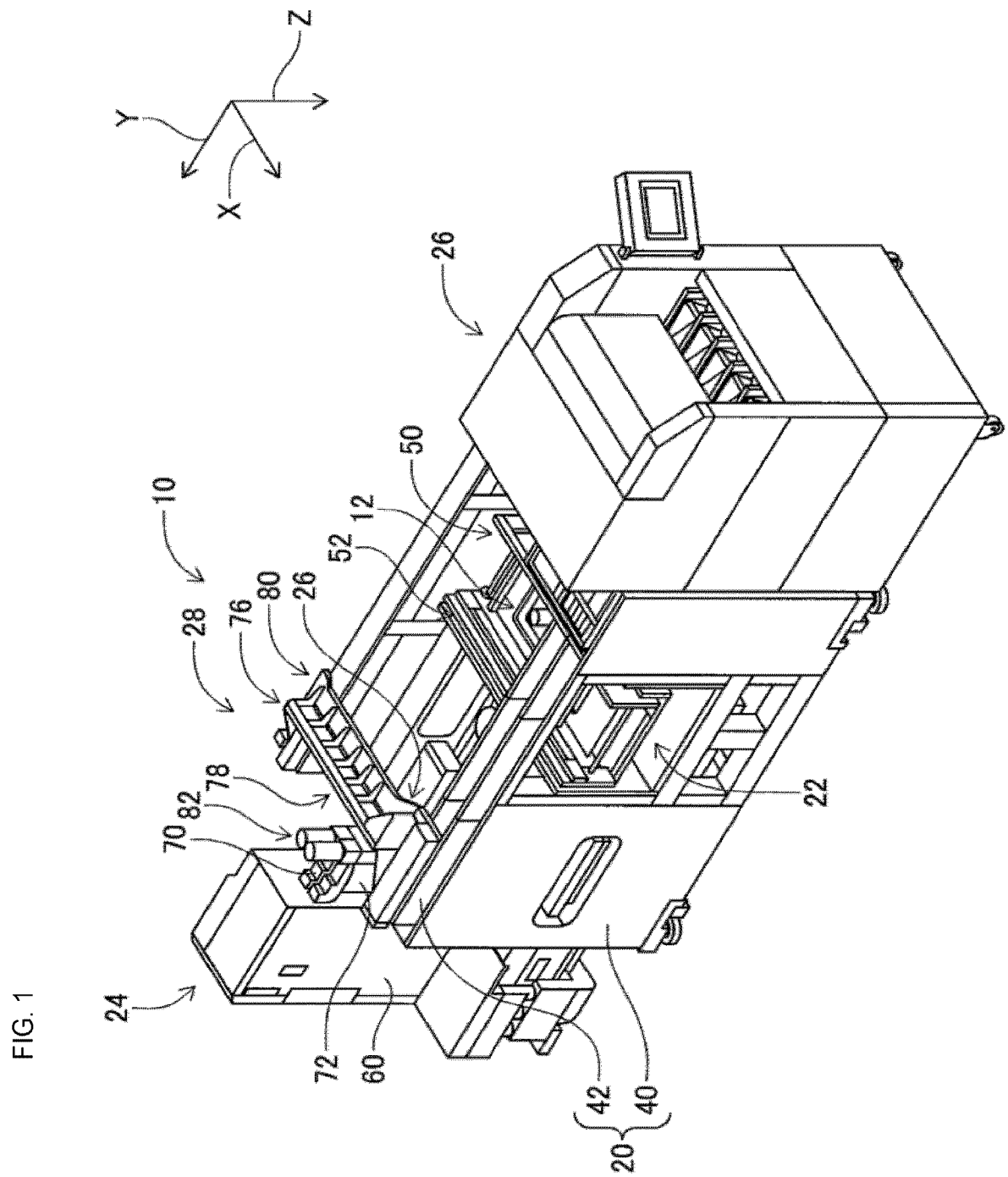
FIG. 1 is a perspective view showing a component mounting machine.
Figure 2:
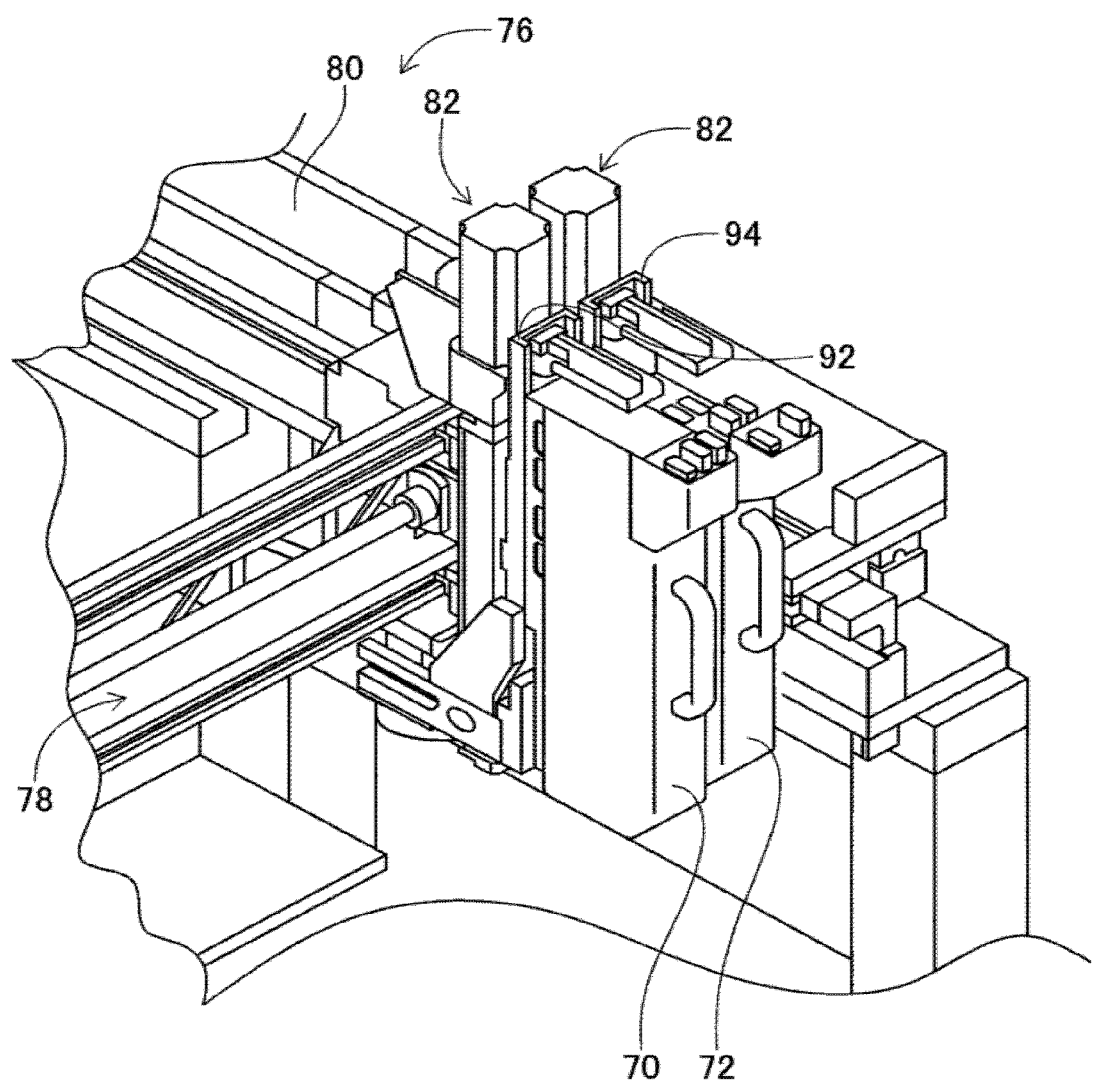
FIG. 2 is a perspective view showing a component mounting device of the component mounting machine.

FIG. 1 shows component mounting machine 10. Component mounting machine 10 is a device that performs a mounting work of a component to circuit substrate 12. Component mounting machine 10 includes device main body 20, substrate conveyance and holding device 22, component supply device 24, bulk component supply device 26, component mounting device 28, and control device 30 (see FIG. 23). Examples of circuit substrate 12 include a circuit board, a substrate which has a three-dimensional structure, and the like, and examples of the circuit board include a printed wiring board, a printed circuit board, and the like.

Device main body 20 is configured by frame 40 and beam 42 suspended on frame 40. Substrate conveyance and holding device 22 is disposed at the center of frame 40 in the front-rear direction, and includes conveyance device 50 and clamping device 52. Conveyance device 50 is a device that conveys circuit substrate 12, and clamping device 52 is a device that holds circuit substrate 12. With this, substrate conveyance and holding device 22 conveys circuit substrate 12 and fixedly holds circuit substrate 12 at a predetermined position. In the following description, the conveyance direction of circuit substrate 12 is referred to as the X-direction, the horizontal direction perpendicular to the X-direction is referred to as the Y-direction, and the vertical direction is referred to as the Z-direction.

Component supply device 24 is disposed at a first end portion of frame 40 in the front-rear direction. Component supply device 24 includes tray-type component supply device 60 and feeder-type component supply device 62 (see FIG. 23). Tray-type component supply device 60 is a device that supplies the component loaded on a tray. Feeder-type component supply device 62 is a device that supplies the component by a tape feeder and a stick feeder (not illustrated).

Bulk component supply device 26 is disposed at a second end portion of frame 40 in the front-rear direction. Bulk component supply device 26 is a device that aligns multiple scattered components to supply the components in an aligned state. That is, bulk component supply device 32 is a device that aligns the multiple components in any orientation to a predetermined orientation to supply the components in the predetermined orientation.

Examples of the component supplied by component supply device 24 and bulk component supply device 26 include an electronic circuit component, components of a solar cell, components of a power module, and the like. Examples of the electronic circuit component include a component with leads, a component without leads, and the like.

Component mounting device 28 is disposed on beam 42 and includes two work heads 70 and 72 and work head moving device 76. Work head moving device 76 is configured by X-direction moving device 78, Y-direction moving device 80, and Z-direction moving device 82. X-direction moving device 78 and Y-direction moving device 80 have electromagnetic motors 84 and 86, respectively (see FIG. 23), and two work heads 70 and 72 are integrally moved to any positions on frame 40 by the operation of each of electromagnetic motors 84 and 86. Also, Z-direction moving device 82 has electromagnetic motors 88 and 90 (see FIG. 23), and sliders 92 and 94 are individually moved in the up-down direction by the operation of each of electromagnetic motors 88 and 90. Further, work heads 70 and 72 are mounted on sliders 92 and 94 so as to be mounted on and separated from sliders 92 and 94. As a result, work heads 70 and 72 are individually moved in the up-down direction by Z-direction moving device 82.

Figure 3:
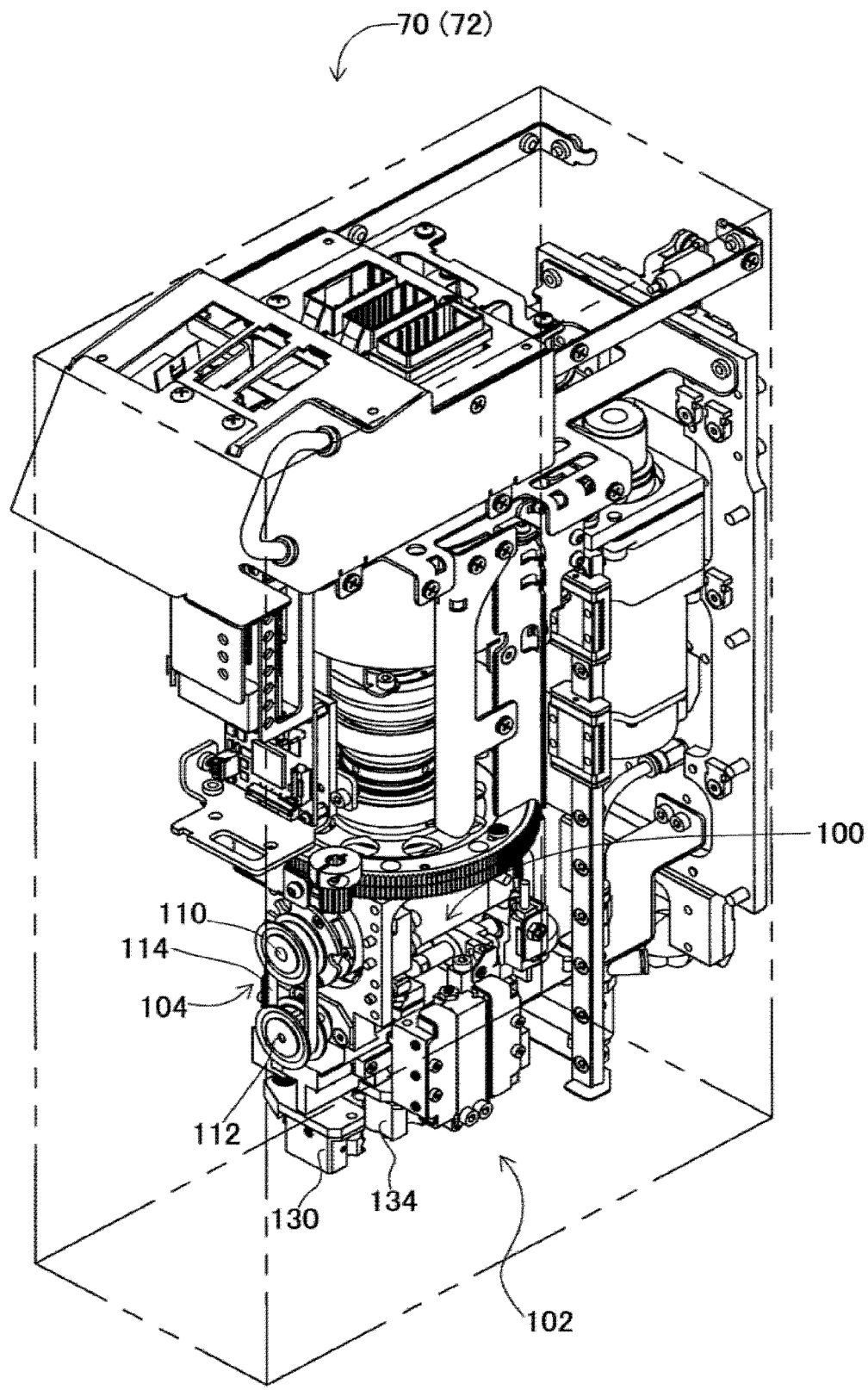
FIG. 3 is a perspective view showing a work head.
Figure 4:
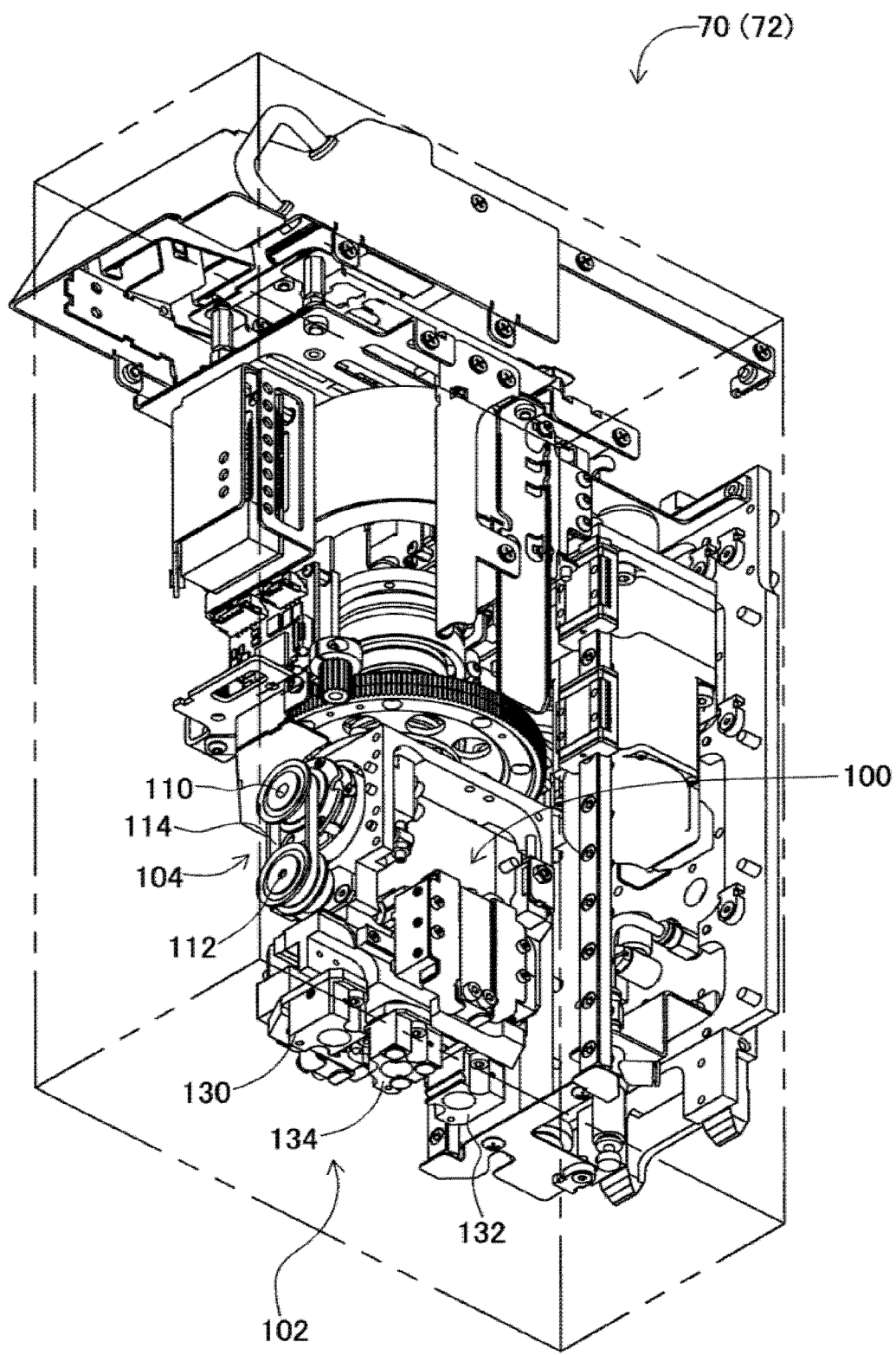
FIG. 4 is a perspective view showing the work head.

Work heads 70 and 72 mount the component on circuit substrate 12. As shown in FIGS. 3 and 4, work heads 70 and 72 are each configured by head main body 100, mounting section 102, and driving mechanism 104. Mounting section 102 is a section on which a holding tool, a gripping claw, and the like described in detail below are mounted, and the holding tool, the gripping claw, and the like, which are mounted on mounting section 102, hold the component by the driving of driving mechanism 104.

Figure 5:
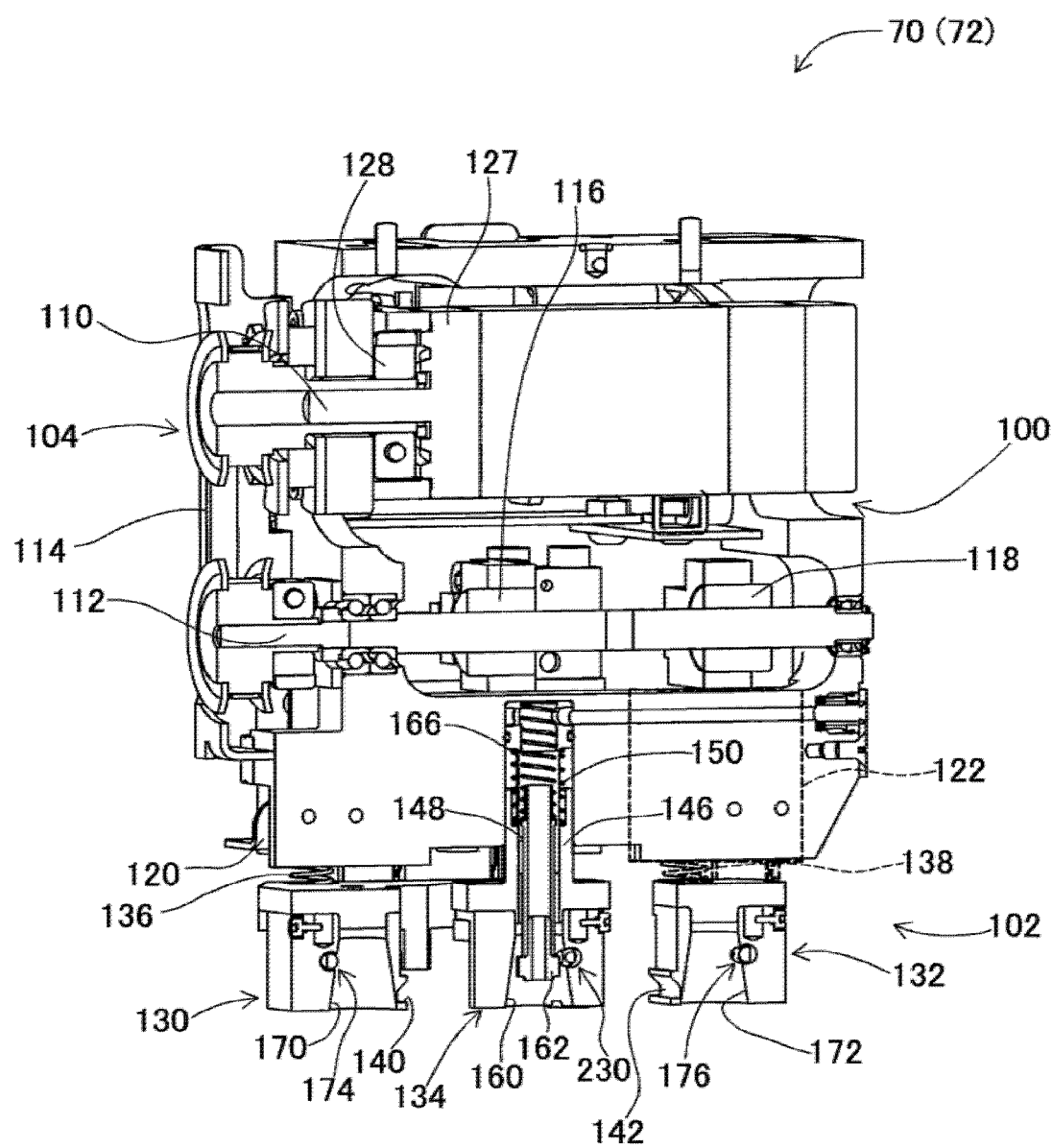
FIG. 5 is an enlarged sectional view of the work head.

Specifically, as shown in FIG. 5, driving mechanism 104 includes first shaft 110, second shaft 112, belt 114, pair of nuts 116 and 118, and pair of sliders 120 and 122. First shaft 110 is held by head main body 100 so as to be rotatable around the axial center in an orientation extending in the horizontal direction, and is controllably rotated by the driving of electromagnetic motor 126 (see FIG. 23). Second shaft 112 is held by head main body 100 below first shaft 110 so as to be rotatable around the axial center in an orientation parallel to first shaft 110. Belt 114 is wound around an end portion of first shaft 110 and an end portion of second shaft 112. As a result, second shaft 112 is also rotated in accordance with the rotation of first shaft 110.

Pair of nuts 116 and 118 are fitted into second shaft 112 in a separated state via a ball screw mechanism (not illustrated), and pair of nuts 116 and 118 are held by head main body 100 so as to be slidable along the axial direction of second shaft 112. As a result, pair of nuts 116 and 118 approach or separate from each other in accordance with rotation of second shaft 112. Pair of sliders 120 and 122 are held on a lower face side of head main body 100 so as to be slidable along the axial direction of second shaft 112, and are fixed to pair of nuts 116 and 118. With such a structure, in driving mechanism 104, first shaft 110 is rotated by the driving of electromagnetic motor 126, and pair of sliders 120 and 122 approach or separate from each other.

Flange section 127 is formed in first shaft 110, and brake pad 128 is disposed so as to face flange section 127. Brake pad 128 is biased in a direction approaching flange section 127 by a compression coil spring (not illustrated), but is separated from flange section 127 against the elastic force of the compression coil spring by the drive force of electromagnetic motor 126 when power is supplied to electromagnetic motor 126. As a result, when power is supplied to electromagnetic motor 126, the rotation of first shaft 110, that is, the approach or separation of pair of sliders 120 and 122 is secured. However, when the power supply to electromagnetic motor 126 is cut off during a power failure or the like, brake pad 128 is pressed to flange section 127 by the elastic force of the compression coil spring. As a result, the approach or separation of pair of sliders 120 and 122 is inhibited during a power failure or the like.

Further, mounting section 102 is configured by pair of gripping blocks 130 and 132, and connecting block 134. Pair of gripping blocks 130 and 132 have a generally rectangular parallelepiped shape and are disposed on a lower face side of pair of sliders 120 and 122 in a state in which the side faces of gripping blocks 130 and 132 face each other. Gripping blocks 130 and 132 are held by sliders 120 and 122 so as to be slidable in the up-down direction, and are biased downward by compression coil springs 136 and 138. In addition, gripping grooves 140 and 142 are formed on opposing side faces of pair of gripping blocks 130 and 132 so as to extend in the width direction of the side faces.

Connecting block 134 is disposed between pair of gripping blocks 130 and 132. Connecting block 134 has substantially the same shape as gripping blocks 130 and 132, and is held by head main body 100 so as to be slidable in the up-down direction via connecting pipe 146. Specifically, connecting pipe 146 is vertically fixed and arranged on an upper face of connecting block 134, and connecting pipe 146 is inserted into insertion hole 148 open on a lower face of head main body 100. Insertion hole 148 is open toward the space between pair of gripping blocks 130 and 132 on the lower face side of head main body 100, and by inserting connecting pipe 146 into insertion hole 148, connecting block 134 extends between pair of gripping blocks 130 and 132.

Connecting pipe 146 is biased downward by compression coil spring 150 inside insertion hole 148. The height of a lower face of connecting block 134 biased to the downmost side by compression coil spring 150 is the same as the height of lower faces of gripping blocks 130 and 132 biased to the downmost side by compression coil springs 136 and 138. That is, in a case in which gripping blocks 130 and 132, and connecting block 134 are not biased upward, the heights of the lower faces of gripping blocks 130 and 132, and connecting block 134 are the same.

In addition, connecting block 134 is formed with fitting hole 160 open on the lower face. The inner diameter of fitting hole 160 is increased toward the down side, and an inner wall surface which defines fitting hole 160 is a taper surface. Fitting hole 160 communicates with the inside of connecting pipe 146 at an upper end portion, and air supply pipe 162 is inserted into fitting hole 160 and connecting pipe 146. Air supply pipe 162 is held inside fitting hole 160 and connecting pipe 146 so as to be slidable in the up-down direction, and is biased downward by compression coil spring 166. Air supply pipe 162 is connected to positive and negative pressure supply device 168 (see FIG. 23). The height of a lower face of air supply pipe 162 biased to the downmost side by compression coil spring 166 is higher than the height of a lower face of connecting block 134 biased to the downmost side by compression coil spring 150. That is, in a case in which connecting block 134 and air supply pipe 162 are not biased upward, the lower face of air supply pipe 162 is positioned inside fitting hole 160 of connecting block 134.

Figure 6:
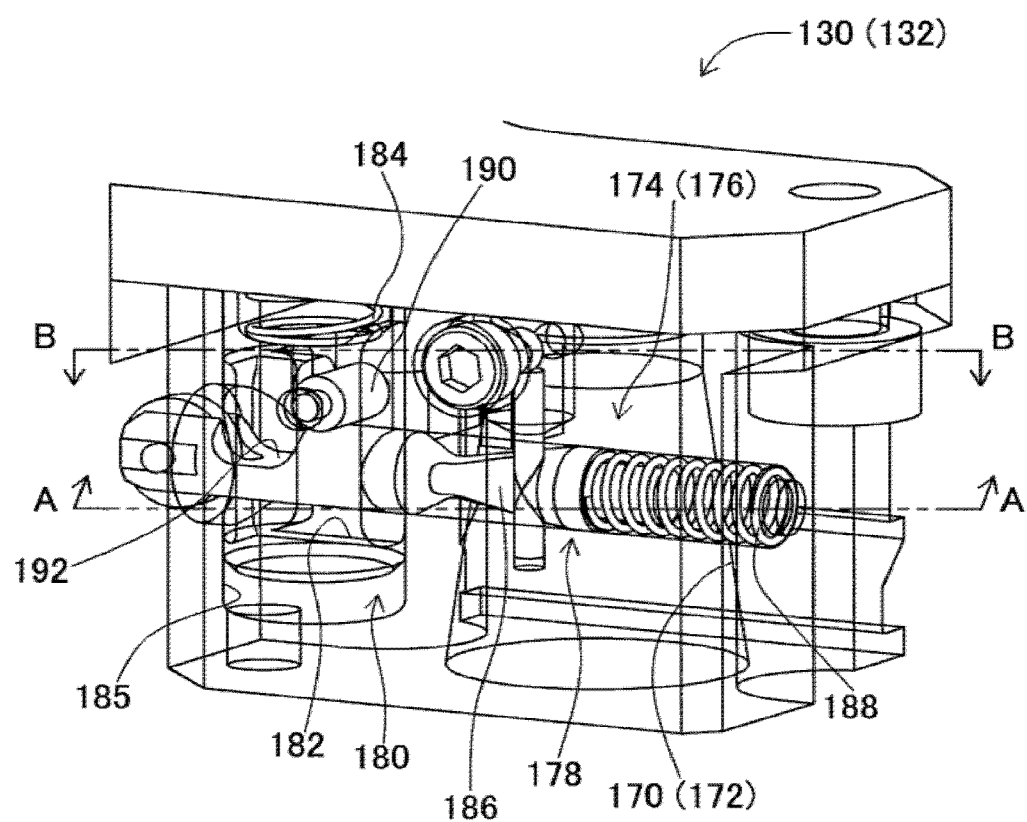
FIG. 6 is a transparent view of a gripping block.

Gripping blocks 130 and 132 are also formed with fitting holes 170 and 172 which have substantially the same shape as fitting hole 160 formed in connecting block 134. Fixing mechanisms 174 and 176 are built in gripping blocks 130 and 132 so as to be exposed to the inside of fitting holes 170 and 172. As shown in FIG. 6, fixing mechanisms 174 and 176 are each configured by generally rod-shaped engaging body 178 and generally barrel-shaped stopper 180. Stopper 180 is held inside gripping block 130 so as to be slidable in the up-down direction on the side of fitting holes 170 and 172, and through hole 182 which penetrates the inside in the right-left direction is formed in stopper 180. Stopper 180 is biased downward by compression coil spring 184. Stopper 180 is held inside slide hole 185 formed in gripping blocks 130 and 132 so as to be slidable in the up-down direction, and slide hole 185 is open in the lower faces of gripping blocks 130 and 132.

On the other hand, engaging body 178 is held inside gripping block 130 so as to be slidable in the right-left direction, into which through hole 182 of stopper 180 is inserted. A first end portion of engaging body 178 which is held inside gripping blocks 130 and 132 so as to be slidable in the right-left direction extends from a side face of gripping block 130. In addition, a side face of engaging body 178 between the second end portion and the center portion is slightly exposed from the inner wall surface of fitting hole 170. Diameter-reducing section 186 is formed in the vicinity of the center in the axial direction of engaging body 178, and the dimension in the radial direction is reduced in diameter-reducing section 186.

Figure 7:
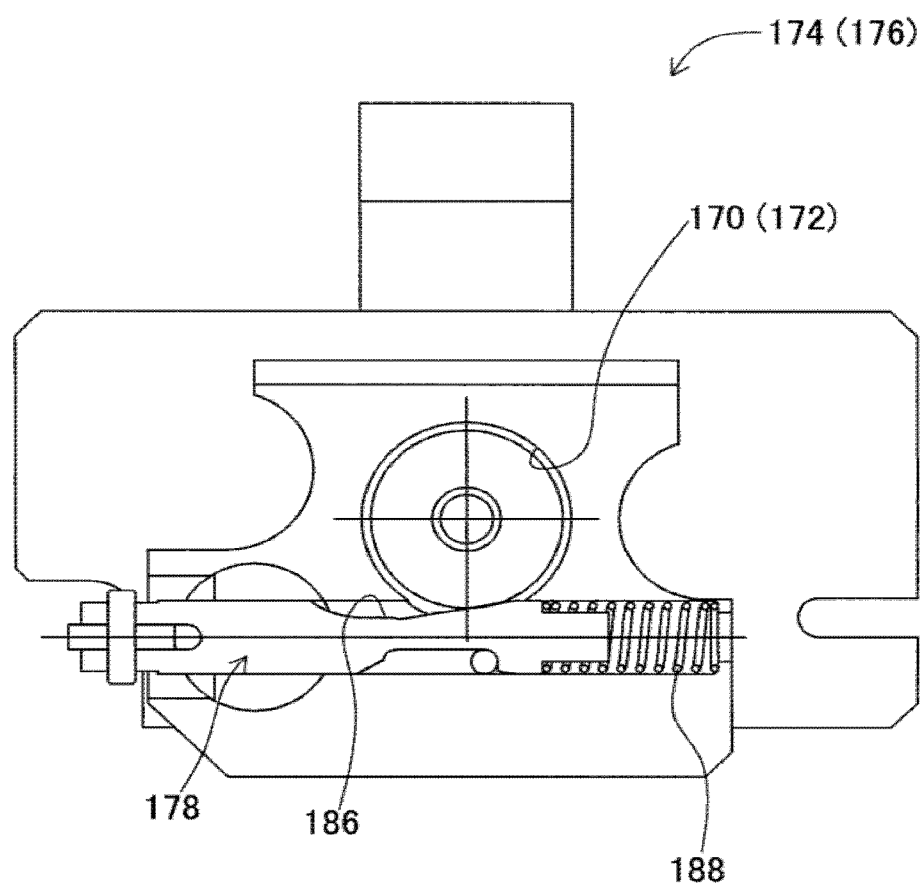
FIG. 7 is a sectional view taken along line AA in FIG. 6.
Figure 8:
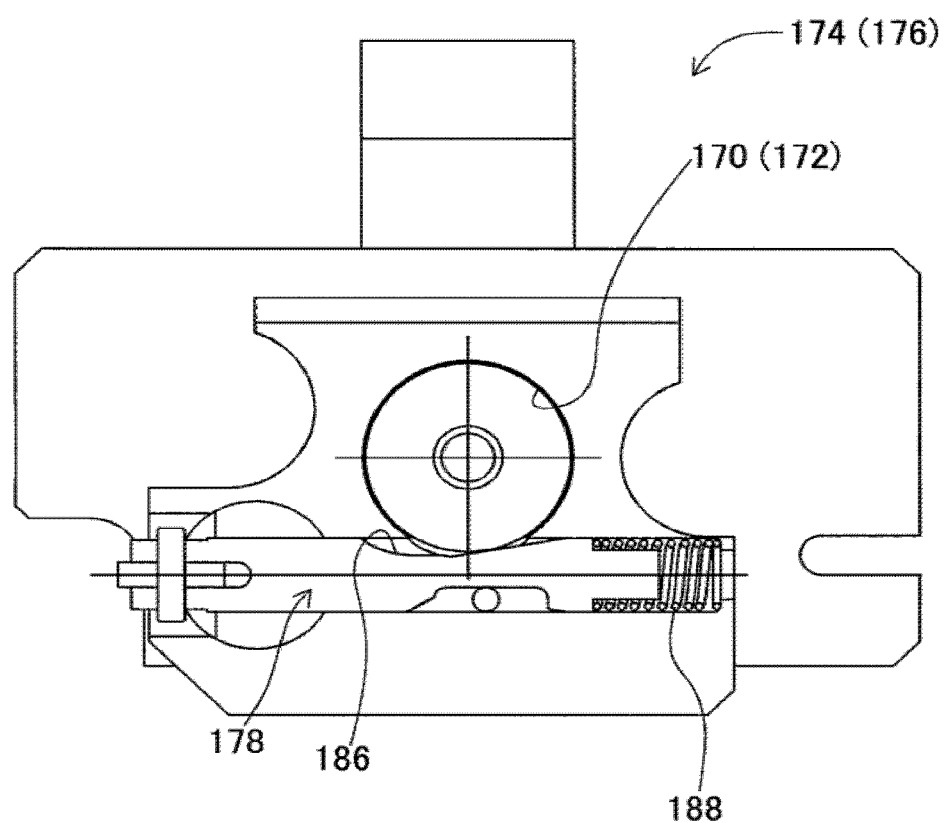
FIG. 8 is a sectional view taken along line AA in FIG. 6.

Engaging body 178 is biased by compression coil spring 188 in a direction extending from the side face of gripping block 130. In a state in which engaging body 178 is biased by the elastic force of compression coil spring 188, diameter-reducing section 186 is not exposed on the inner wall surfaces of fitting holes 170 and 172, as shown in FIG. 7, which is a sectional view taken along the line AA in FIG. 6, and a portion of engaging body 178 other than diameter-reducing section 186, that is, a portion which has a large dimension in the radial direction is exposed on the inner wall surfaces of fitting holes 170 and 172. However, engaging body 178 slides toward the inside of gripping blocks 130 and 132 against the elastic force of compression coil spring 188, so that diameter-reducing section 186 is exposed on the inner wall surfaces of fitting holes 170 and 172 as shown in FIG. 8. In a state in which diameter-reducing section 186 is exposed on the inner wall surfaces of fitting holes 170 and 172, diameter-reducing section 186 does not protrude toward the inside from the inner wall surfaces of fitting holes 170 and 172, and diameter-reducing section 186 is in a state of being recessed from the inner wall surfaces of fitting holes 170 and 172. On the other hand, in a state in which a portion of engaging body 178 other than diameter-reducing section 186 is exposed on the inner wall surfaces of fitting holes 170 and 172, the portion protrudes toward the inside from the inner wall surfaces of fitting holes 170 and 172, and the portion is in a state of protruding from the inner wall surfaces of fitting holes 170 and 172.

Figure 9:
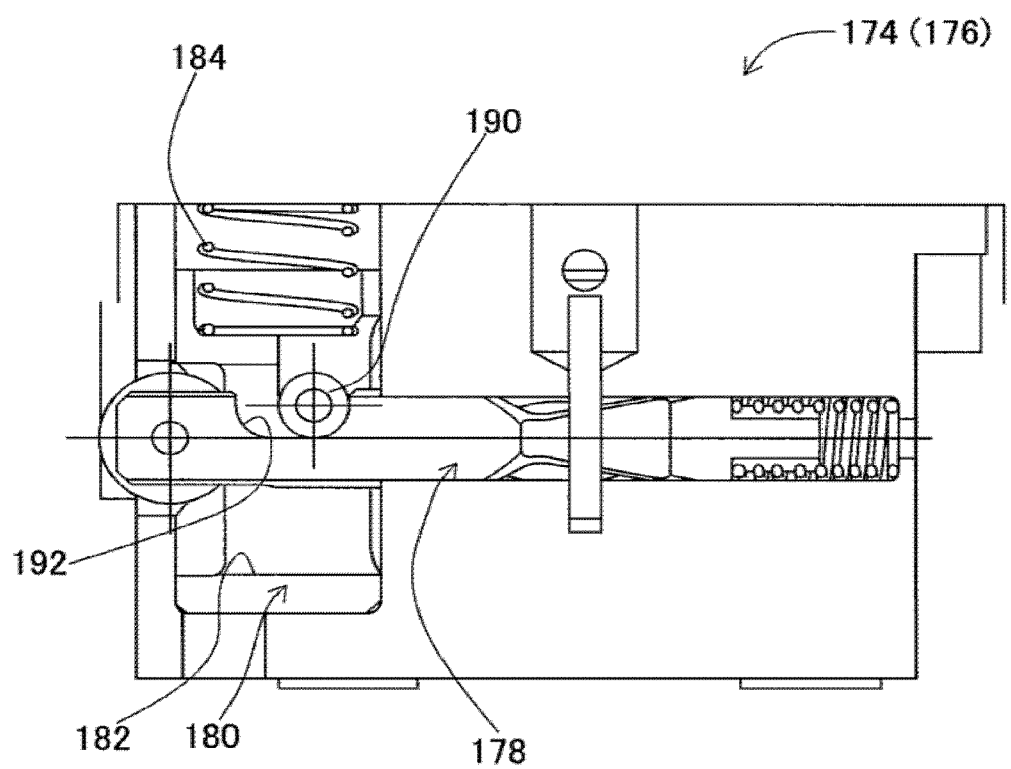
FIG. 9 is a sectional view taken along line BB in FIG. 6.
Figure 10:
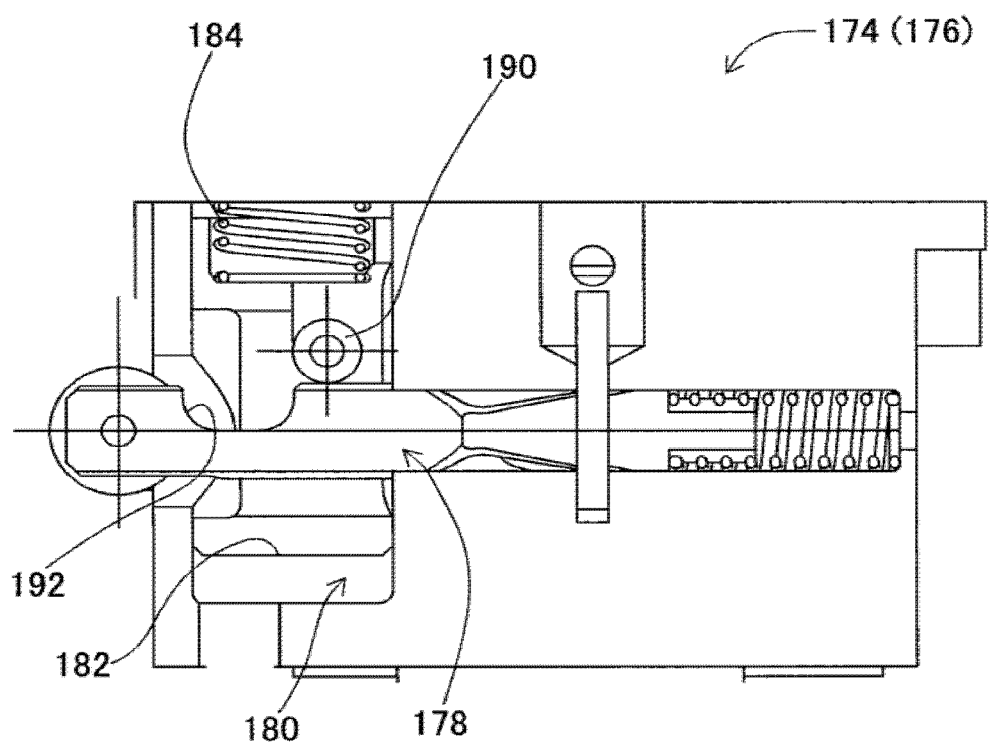
FIG. 10 is a sectional view taken along line BB in FIG. 6.

Further, as shown in FIG. 6, protruding section 190 which extends in a direction orthogonal to engaging body 178 into which through hole 182 is inserted is disposed in through hole 182 of stopper 180. Cutout section 192 is formed in engaging body 178 so as to face protruding section 190 on the outer peripheral surface of the portion into which through hole 182 is inserted. Therefore, stopper 180 is biased downward by the elastic force of compression coil spring 184, so that protruding section 190 engages with cutout section 192 of engaging body 178 as shown in FIG. 9 which is a sectional view taken along the line BB in FIG. 6. On the other hand, stopper 180 slides upward against the elastic force of compression coil spring 184, so that engaging body 178, which is biased by the elastic force of compression coil spring 188, slides in a direction extending from the side face of gripping block 130, and protruding section 190 disengages from cutout section 192 of engaging body 178 as shown in FIG. 10. In a state in which protruding section 190 engages with cutout section 192, that is, a state in which stopper 180 is lowered by the elastic force of compression coil spring 184, engaging body 178 slides toward the inside of gripping block 130 against the elastic force of compression coil spring 188, and diameter-reducing section 186 is exposed on the inner wall surface of fitting hole 170. On the other hand, in a state in which protruding section 190 disengages from cutout section 192, that is, a state in which stopper 180 rises against the elastic force of compression coil spring 184, engaging body 178 slides in a direction extending from gripping block 130 by the elastic force of compression coil spring 188, and a portion other than diameter-reducing section 186 is exposed on the inner wall surface of fitting hole 170.

Figure 11:
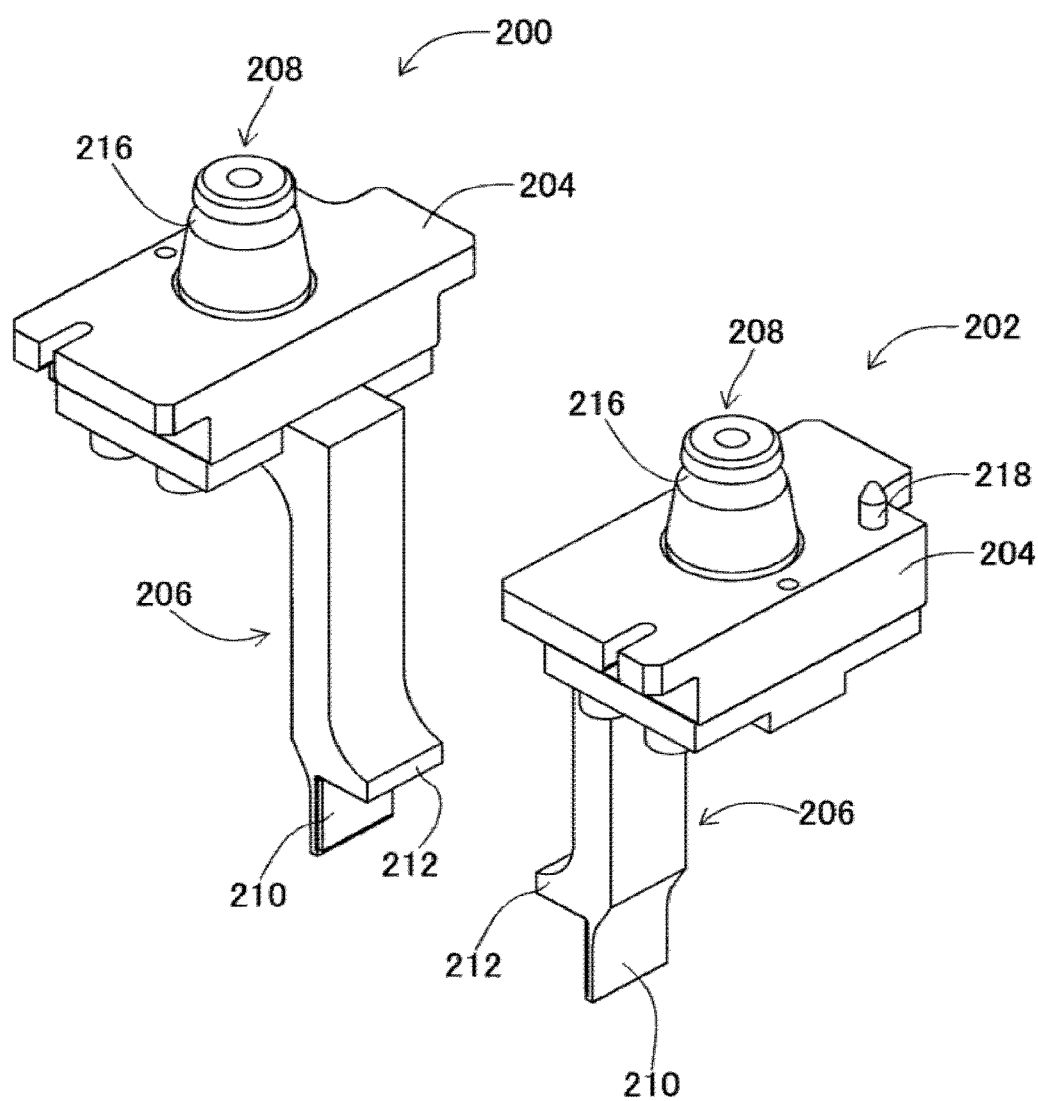
FIG. 11 is a perspective view showing a gripping claw.

Gripping claws 200 and 202 shown in FIG. 11 are mounted on gripping blocks 130 and 132 on which fixing mechanisms 174 and 176 which have such a structure are disposed. Specifically, gripping claws 200 and 202 are each configured by flange section 204, claw section 206 which extends downward from flange section 204, and connecting section 208 which extends upward from flange section 204. A tip portion, that is, a lower end portion of claw section 206 is generally L-shaped, and is configured by gripping section 210 which extends downward, and pressing section 212 which extends in a direction orthogonal to gripping section 210 from the upper end of gripping section 210.

Connecting section 208 has a truncated cone shape, that is, a shape in which an apex portion of the cone is removed, and the dimension of connecting section 208 in the radial direction is decreased toward the upper side. In addition, the overall dimension of connecting section 208 in the radial direction is slightly smaller than the overall dimension of fitting holes 170 and 172 of gripping blocks 130 and 132 in the radial direction. Engagement groove 216 which extends in the circumferential direction is formed on the outer peripheral surface of connecting section 208. Convex section 218 which extends upward is formed on an upper face of flange section 204. The relative position of connecting section 208 and convex section 218 is the same as the relative position of the openings of fitting holes 170 and 172 and the opening of slide hole 185 with respect to the lower faces of gripping blocks 130 and 132.

Figure 12:
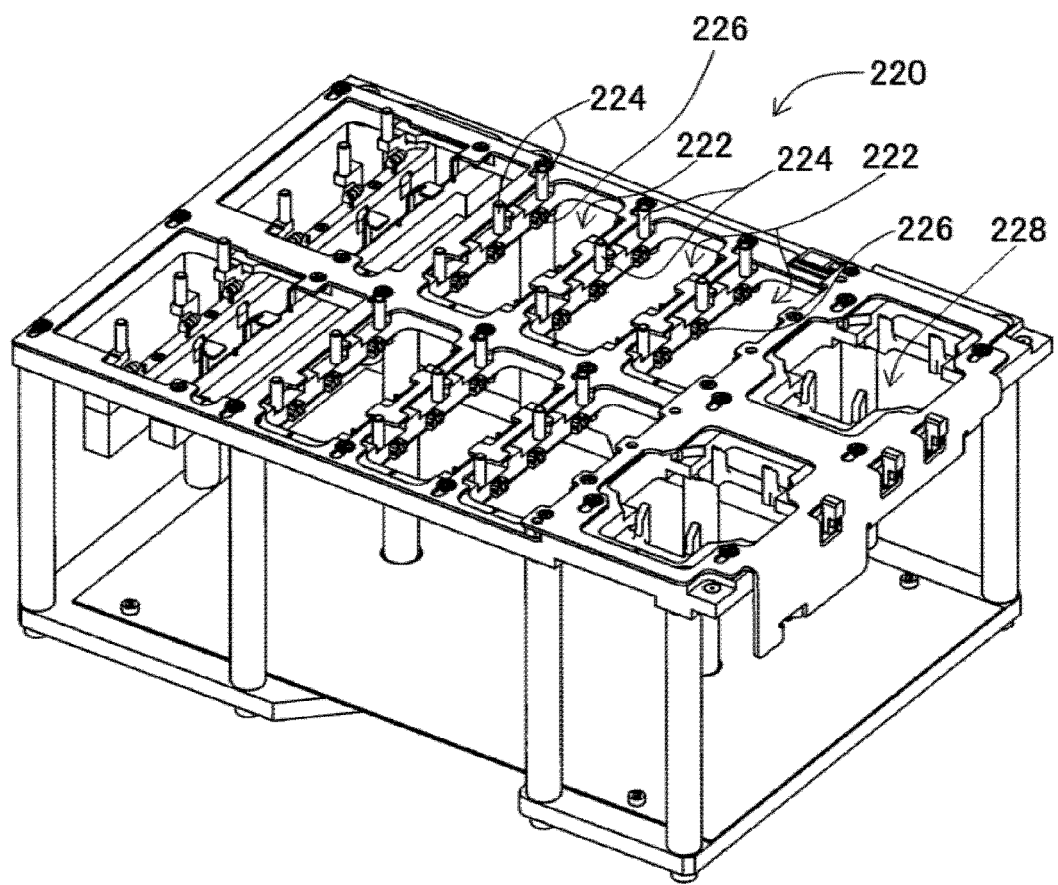
FIG. 12 is a perspective view showing a loading table.

Gripping claws 200 and 202 are loaded on loading table 220 shown in FIG. 12. Loading table 220 is installed between substrate conveyance and holding device 22 and component supply device 24 on an upper face of frame 40 of component mounting machine 10. Multiple first placing holes 222 are formed in loading table 220. The inner dimension of first placing hole 222 is larger than the outer dimension of claw section 206 of gripping claws 200 and 202 in the circumferential direction, and is smaller than the outer dimension of flange section 204 in the circumferential direction. Therefore, gripping claws 200 and 202 are loaded on loading table 220 in a state in which claw section 206 is inserted into first placing hole 222 and flange section 204 is latched on the edge portion which defines first placing hole 222.

Further, work heads 70 and 72 are moved above loading table 220 by the operation of work head moving device 76 and are lowered. In this case, work heads 70 and 72 are lowered such that connecting sections 208 of gripping claws 200 and 202 are inserted into fitting holes 170 and 172 of gripping blocks 130 and 132, and convex sections 218 of gripping claws 200 and 202 are also inserted into slide holes 185 of gripping blocks 130 and 132. Before connecting sections 208 are inserted into fitting holes 170 and 172, in fixing mechanisms 174 and 176, stopper 180 is lowered, protruding section 190 engages with cutout section 192, and diameter-reducing section 186 of engaging body 178 is exposed on the inner wall surfaces of fitting holes 170 and 172. That is, in fitting holes 170 and 172, diameter-reducing section 186 is in a state of being recessed from the inner wall surfaces of fitting holes 170 and 172. Therefore, even in a case in which connecting sections 208 of gripping claws 200 and 202 are inserted into fitting holes 170 and 172, connecting sections 208 are appropriately fitted into fitting holes 170 and 172 without interfering with engaging body 178.

However, at the timing when connecting sections 208 are fitted into fitting holes 170 and 172, convex section 218 inserted into slide hole 185 presses stopper 180 upward, so that protruding section 190 disengages from cutout section 192. Therefore, engaging body 178 slides in a direction extending from gripping blocks 130 and 132 by the elastic force of compression coil spring 188, and a portion of engaging body 178 other than diameter-reducing section 186 is exposed on the inner wall surfaces of fitting holes 170 and 172. That is, in fitting holes 170 and 172, a portion of engaging body 178 other than diameter-reducing section 186 is in a state of protruding from the inner wall surfaces of fitting holes 170 and 172. In this case, engaging body 178 which protrudes from the inner wall surfaces of fitting holes 170 and 172 engages with engagement groove 216 of connecting section 208. As described above, connecting sections 208 of gripping claws 200 and 202 are fitted into fitting holes 170 and 172 of gripping blocks 130 and 132, and engaging body 178 which protrudes from the inner wall surfaces of fitting holes 170 and 172 engages with engagement groove 216, so that gripping claws 200 and 202 are mounted on gripping blocks 130 and 132 in a state in which falling off from gripping blocks 130 and 132 is prevented.

Figure 13:
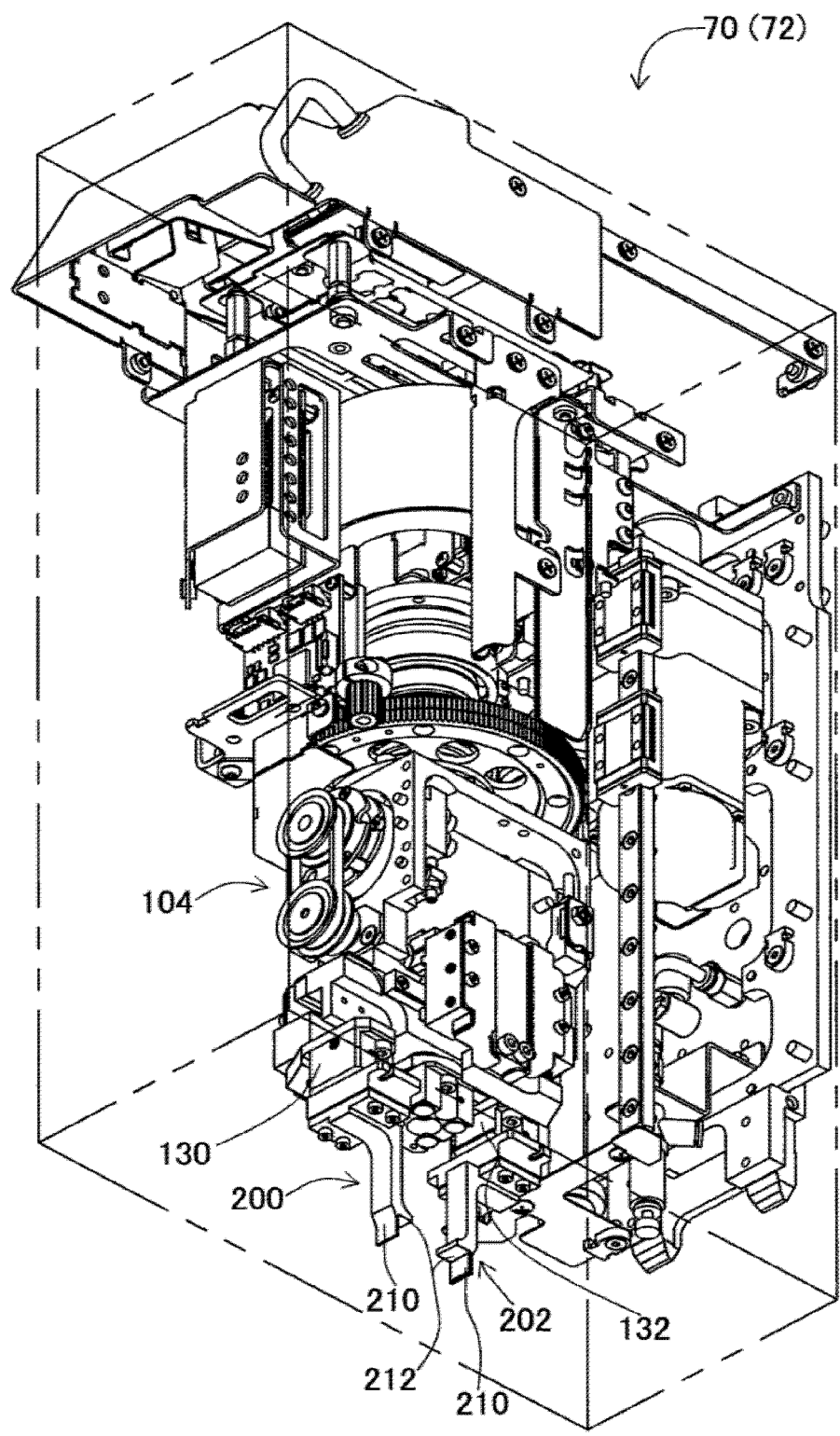
FIG. 13 is a perspective view showing the work head in a state in which the gripping claw is mounted.

As shown in FIG. 13, gripping claw 200 is mounted on gripping block 130, and gripping claw 202 is mounted on gripping block 132. In this case, pair of gripping claws 200 and 202 are mounted on pair of gripping blocks 130 and 132 such that pressing sections 212 thereof face each other. As described above, by mounting gripping claws 200 and 202 on gripping blocks 130 and 132, the mounting work of the component is performed by work heads 70 and 72. That is, pair of gripping blocks 130 and 132 approach each other by the driving of driving mechanism 104, the component is gripped by gripping sections 210 of pair of gripping claws 200 and 202. Then, in a state in which the component is loaded on the predetermined position of circuit substrate 12, pair of gripping blocks 130 and 132 are separated from each other by the driving of driving mechanism 104, so that the grip of the component by gripping section 210 is released, and the component is mounted on circuit substrate 12. In addition, in a case in which the component gripped by gripping section 210 is mounted on circuit substrate 12, the component can be pressed to circuit substrate 12 by pressing section 212. Since gripping blocks 130 and 132 are configured to be slidable in the up-down direction as described above, the impact generated when the component is pressed is absorbed by the sliding of gripping blocks 130 and 132 in the up-down direction.

In a case in which the mounting work by gripping claws 200 and 202 is completed, gripping claws 200 and 202 are returned to loading table 220. Specifically, by the operation of work head moving device 76, work heads 70 and 72 are moved above loading table 220, and work heads 70 and 72 are lowered such that claw section 206 of gripping claw 200 is inserted into first placing hole 222. In this case, work heads 70 and 72 are lowered to a position in which the end portion of engaging body 178 which extends from the side face of gripping block 130 faces protruding section 224 erected on the edge portion which defines first placing hole 222. The operation of work head moving device 76 is controlled such that the end portion of engaging body 178 which extends from the side face of gripping block 130 contacts protruding section 224. As a result, the end portion of engaging body 178 which extends from the side face of gripping block 130 is moved toward protruding section 224, and is pressed to the inside of gripping blocks 130 and 132 by protruding section 224. In this case, protruding section 190 of stopper 180 engages with cutout section 192 of engaging body 178, and diameter-reducing section 186 of engaging body 178 is exposed on the inner wall surfaces of fitting holes 170 and 172. Therefore, engaging body 178 disengages from engagement groove 216 of connecting section 208 of gripping claws 200 and 202, and gripping claws 200 and 202 fall off from gripping blocks 130 and 132 by their own weights. As a result, gripping claws 200 and 202 are returned from gripping blocks 130 and 132 to loading table 220. As described above, in component mounting machine 10, gripping claws 200 and 202 are automatically mounted on and separated from gripping blocks 130 and 132.

In a case in which gripping claws 200 and 202 are returned to loading table 220, when the end portion of engaging body 178 which extends from the side face of gripping block 130 is pressed to protruding section 224, gripping claw 200 may be loaded in a state of being biased to a position closer to protruding section 224 inside first placing hole 222. Therefore, pressing member 226 which protrudes toward the inside of first placing hole 222 is disposed below protruding section 224 at the edge portion which defines first placing hole 222. Pressing member 226 is biased to the inside of first placing hole 222 by the compression coil spring (not illustrated). As a result, gripping claws 200 and 202 loaded inside first placing hole 222 in a state of being biased to the position closer to protruding section 224 are pressed by pressing member 226, so that the deviation of the placing positions of gripping claws 200 and 202 in first placing hole 222 is canceled.

Figure 14:
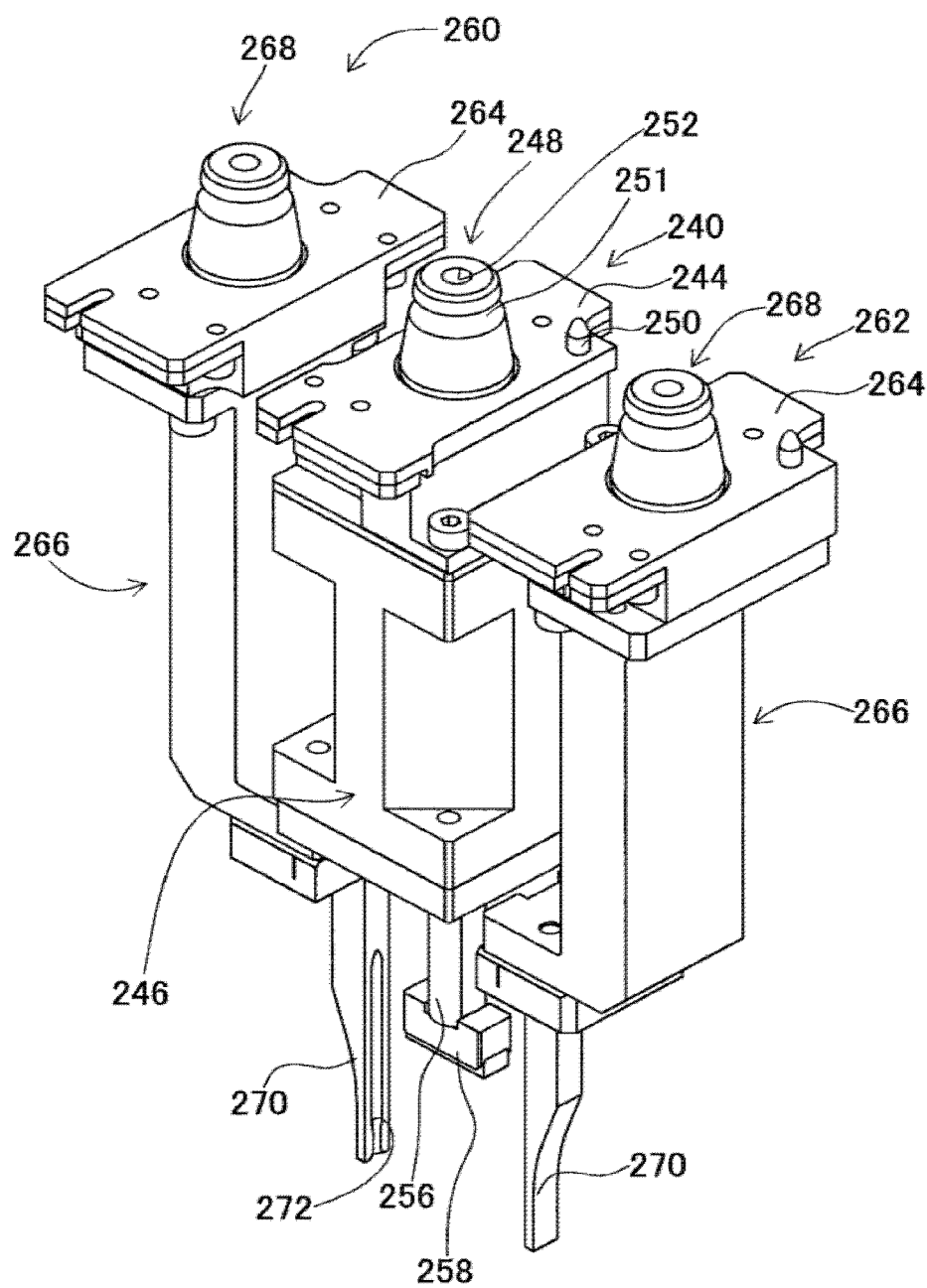
FIG. 14 is a perspective view showing the gripping claw and a pusher.

In addition, fixing mechanism 230 (see FIG. 5) which has substantially the same structure as fixing mechanisms 174 and 176 built in gripping blocks 130 and 132 is also built in connecting block 134. Therefore, the description of fixing mechanism 230 will be omitted, and as the symbols of the constituent elements of fixing mechanisms 174 and 176, that is, engaging body 178 and the like are used as the symbols of the constituent elements of fixing mechanism 230, that is, the engaging body and the like. Pusher 240 shown in FIG. 14 is mounted on connecting block 134 by using fixing mechanism 230.

Specifically, pusher 240 is configured by flange section 244, main body section 246 which extends downward from flange section 244, and connecting section 248 which extends upward from flange section 244. Flange section 244 has the same shape as flange section 204 of gripping claws 200 and 202, and convex section 250 is formed on the upper face of flange section 244 similarly to flange section 204. Connecting section 248 has the same shape as connecting section 208 of gripping claws 200 and 202, and engagement groove 251 which extends in the circumferential direction is formed on the outer peripheral surface of connecting section 248 similarly to connecting section 208. However, unlike connecting section 208, connecting section 248 is formed with through hole 252 which penetrates in the up-down direction. Through hole 252 also penetrates flange section 244 and reaches the inside of main body section 246. Inside main body section 246, through hole 252 communicates with an air chamber (not illustrated). A piston (not illustrated) is fitted into the air chamber so as to be slidable in the up-down direction. Rod 256 is fixed to the piston, and rod 256 extends downward from the lower face of main body section 246. Pressing block 258 is fixed to the lower end of rod 256. The piston is biased upward by the elastic force of the coil spring inside main body section 246.

Pusher 240 which has such a structure is loaded on first placing hole 222 of loading table 220 similarly to gripping claws 200 and 202. Then, connecting section 248 of pusher 240 is inserted into fitting hole 160 of connecting block 134, and pusher 240 is mounted on connecting block 134 via fixing mechanism 230. A method of mounting pusher 240 on connecting block 134 is the same as a method of mounting gripping claws 200 and 202 on gripping blocks 130 and 132. That is, the operation of work head moving device 76 is controlled such that connecting section 248 of pusher 240 is inserted into fitting hole 160 of connecting block 134, and the convex section 250 of pusher 240 is inserted into slide hole 185 of connecting block 134. As a result, connecting section 248 of pusher 240 is fitted into fitting hole 160 of connecting block 134, and engaging body 178 of fixing mechanism 230 engages with engagement groove 216 inside fitting hole 160, so that pusher 240 is mounted on connecting block 134 in a state in which falling off from connecting block 134 is prevented.

However, in connecting block 134, unlike gripping blocks 130 and 132, pusher 240 mounted on connecting block 134 communicates with air supply pipe 162 inside fitting hole 160. Specifically, by inserting connecting section 248 of pusher 240 into fitting hole 160, an upper face of connecting section 248 contacts the lower face of air supply pipe 162. Since air supply pipe 162 is biased downward by compression coil spring 166 as described above, air supply pipe 162 is pressed upward by connecting section 248 by inserting connecting section 248 into fitting hole 160. As a result, through hole 252 open on the upper face of connecting section 248 communicates with air supply pipe 162 in a state in which through hole 252 is in close contact with air supply pipe 162.

As described above, through hole 252 of connecting section 248 communicates with air supply pipe 162, so that pusher 240 mounted on connecting block 134 is operated. That is, in a case in which a positive pressure is supplied to air supply pipe 162 from positive and negative pressure supply device 168, the piston is lowered inside the air chamber, and pressing block 258 is lowered together with rod 256. Further, in a case in which air supply pipe 162 is opened to the atmosphere by positive and negative pressure supply device 168, the piston rises inside the air chamber by the elastic force of the coil spring. As a result, pressing block 258 rises together with rod 256.

Further, in a case in which pusher 240 is mounted on connecting block 134, gripping claws 260 and 262 shown in FIG. 14 are mounted on gripping blocks 130 and 132. Gripping claws 260 and 262 are configured by flange section 264, claw section 266, and connecting section 268 similarly to gripping claws 200 and 202. Flange section 264 and connecting section 268 have the same shapes as flange section 204 and connecting section 208 of gripping claws 200 and 202. Further, the tip portion of claw section 266 is configured by only gripping section 270 which extends downward, unlike claw section 206 of gripping claws 200 and 202. Gripping groove 272 which extends in the up-down direction is formed on a side face of gripping section 270. Gripping claws 260 and 262 which have such a structure are also loaded on first placing hole 222 of loading table 220 and mounted on gripping blocks 130 and 132 similarly to gripping claws 200 and 202. A method of mounting gripping claws 260 and 262 on gripping blocks 130 and 132 is the same as that of mounting gripping claws 200 and 202 on gripping blocks 130 and 132, and thus the description thereof will be omitted.

Figure 15:
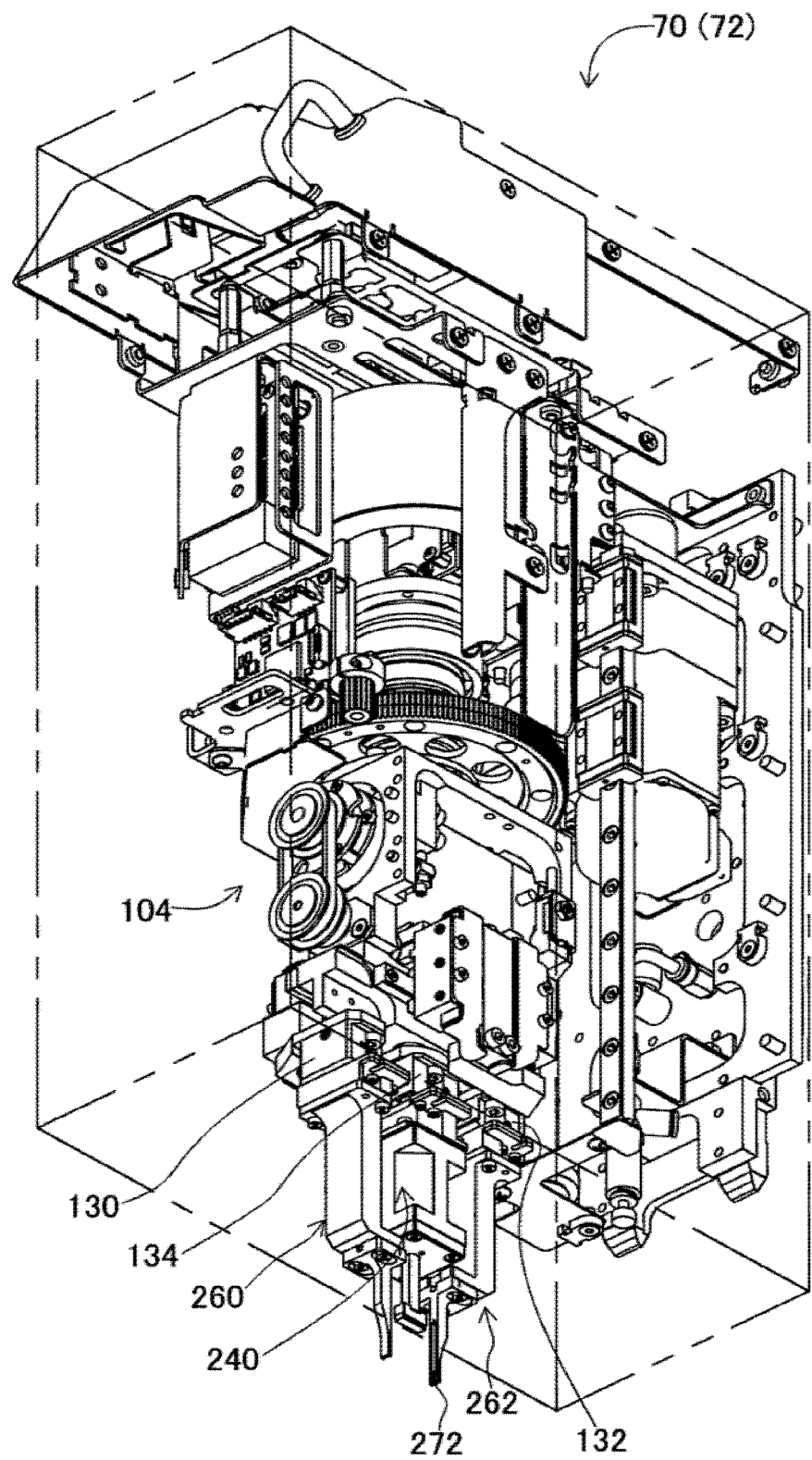
FIG. 15 is a perspective view showing the work head in a state in which the gripping claw and the pusher are mounted.

Incidentally, as shown in FIG. 15, gripping claw 260 is mounted on gripping block 130, and gripping claw 262 is mounted on gripping block 132. In this case, pair of gripping claws 260 and 262 are mounted on pair of gripping blocks 130 and 132 such that gripping grooves 272 thereof face each other. As described above, gripping claws 260 and 262 are mounted on gripping blocks 130 and 132, and pusher 240 is mounted on connecting block 134, so that the mounting work of the axial component is performed by work head 70.

Figure 16:
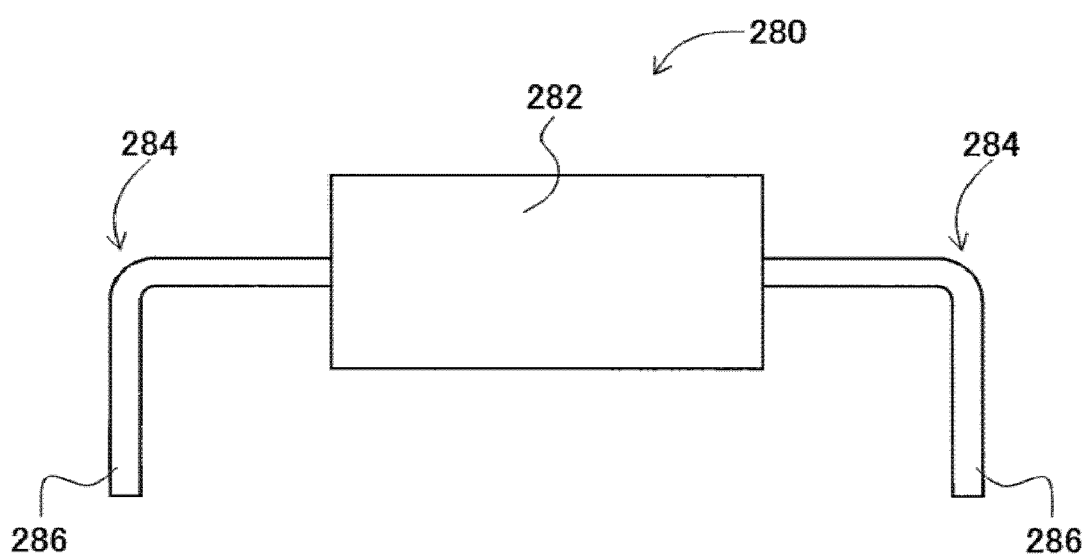
FIG. 16 is a view showing an axial component.

Specifically, as shown in FIG. 16, axial component 280 is configured by component main body 282 and pair of lead wires 284. Component main body 282 has a generally cylindrical shape, and pair of lead wires 284 each extend in opposite directions from both end faces of component main body 282. Pair of lead wires 284 are bent in the same direction at a generally right angle, and a tip portion of each lead wire 284 is bent portion 286. In work head 70, before axial component 280 is held, the operation of driving mechanism 104 is controlled, and the distance between gripping sections 270 of pair of gripping claws 260 and 262 is substantially the same as the distance between bent portions 286 of pair of lead wires 284 of axial component 280. Axial component 280 is supplied in an orientation of axial component 280 shown in FIG. 16, that is, an orientation in which bent portions 286 is directed to the down side in feeder-type component supply device 62 or the like.

Further, work head 70 is lowered at a supply position of axial component 280, so that bent portions 286 of pair of lead wires 284 of axial component 280 are press-fitted into gripping grooves 272 formed in gripping sections 270 of pair of gripping claws 260 and 262. As a result, axial component 280 is gripped by gripping claws 260 and 262. The operation of work head moving device 76 is controlled such that bent portion 286 of axial component 280 gripped by gripping claws 260 and 262 is inserted into a through hole (not illustrated) formed in circuit substrate 12. Next, bent portion 286 is inserted into the through hole, pusher 240 is operated by the supply of the positive pressure to air supply pipe 162, and pressing block 258 is lowered. As a result, axial component 280 gripped by gripping section 270 of pair of gripping claws 260 and 262 is pressed to the down side by pressing block 258, is separated from gripping claws 260 and 262, and is mounted on circuit substrate 12.

Then, in a case in which the mounting work of axial component 280 by gripping claws 260 and 262 and pusher 240 is completed, gripping claws 260 and 262 and pusher 240 are returned to loading table 220. A method of returning gripping claws 260 and 262 and pusher 240 to loading table 220 is the same as a method of returning gripping claws 200 and 202 to loading table 220. That is, by pressing the end portion of engaging body 178 which extends from the side faces of gripping blocks 130 and 132 and connecting block 134 by protruding section 224 of loading table 220, engaging body 178 disengages from connecting sections 248 and 268 inside fitting holes 160, 170, and 172. As a result, gripping claws 260 and 262 and pusher 240 are separated from gripping blocks 130 and 132 and connecting block 134, and are returned to first placing hole 222 of loading table 220. As described above, gripping claws 260 and 262 and pusher 240 are also automatically mounted on and separated from gripping blocks 130 and 132 and connecting block 134. Gripping claws 260 and 262 and pusher 240 returned to first placing hole 222 are also pressed by pressing member 226 similarly to gripping claws 200 and 202, so that the deviation of the placing positions of gripping claws 260 and 262 and pusher 240 in first placing hole 222 is canceled.

Figure 17:
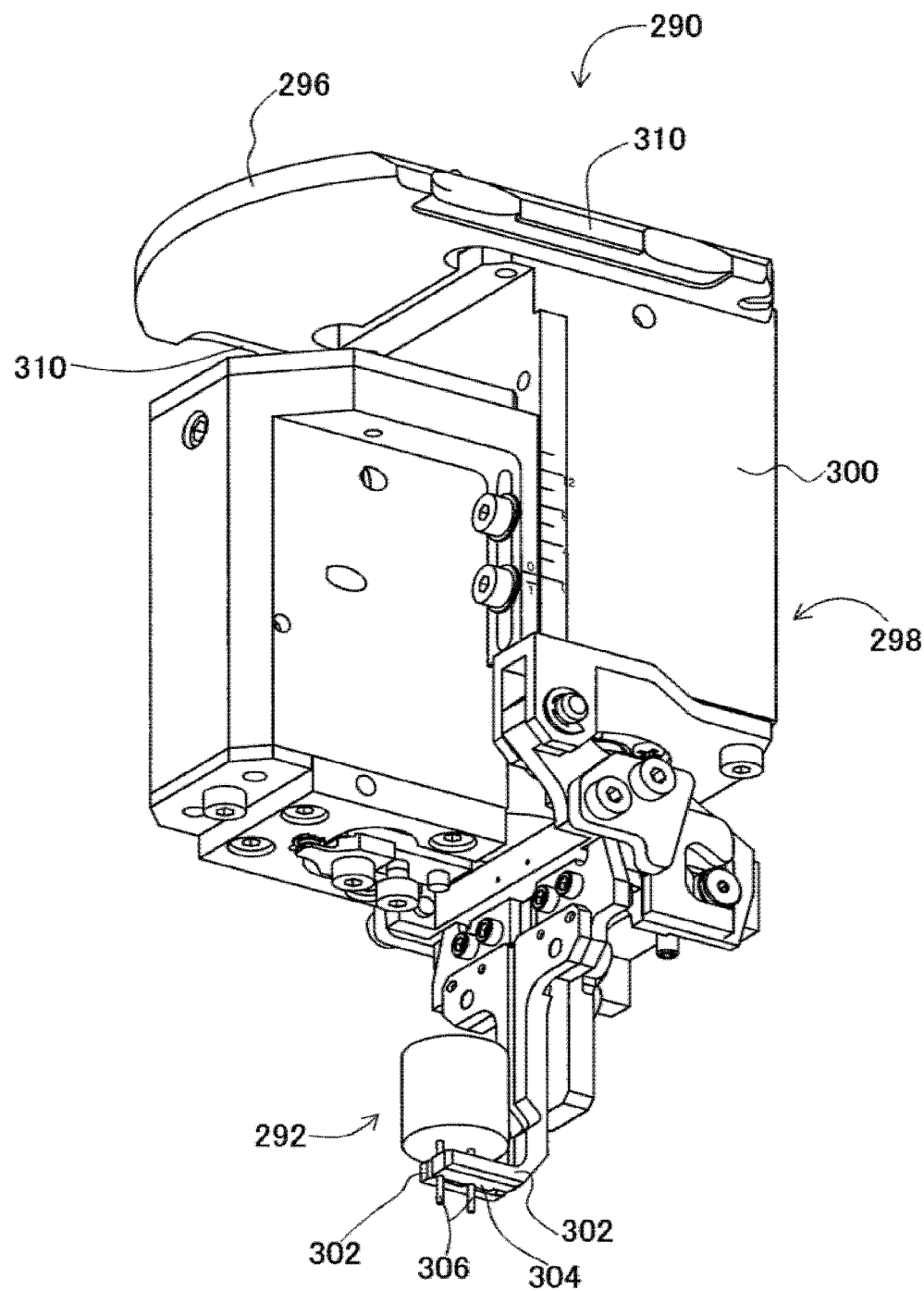
FIG. 17 is a perspective view showing a component holding tool.
Figure 18:
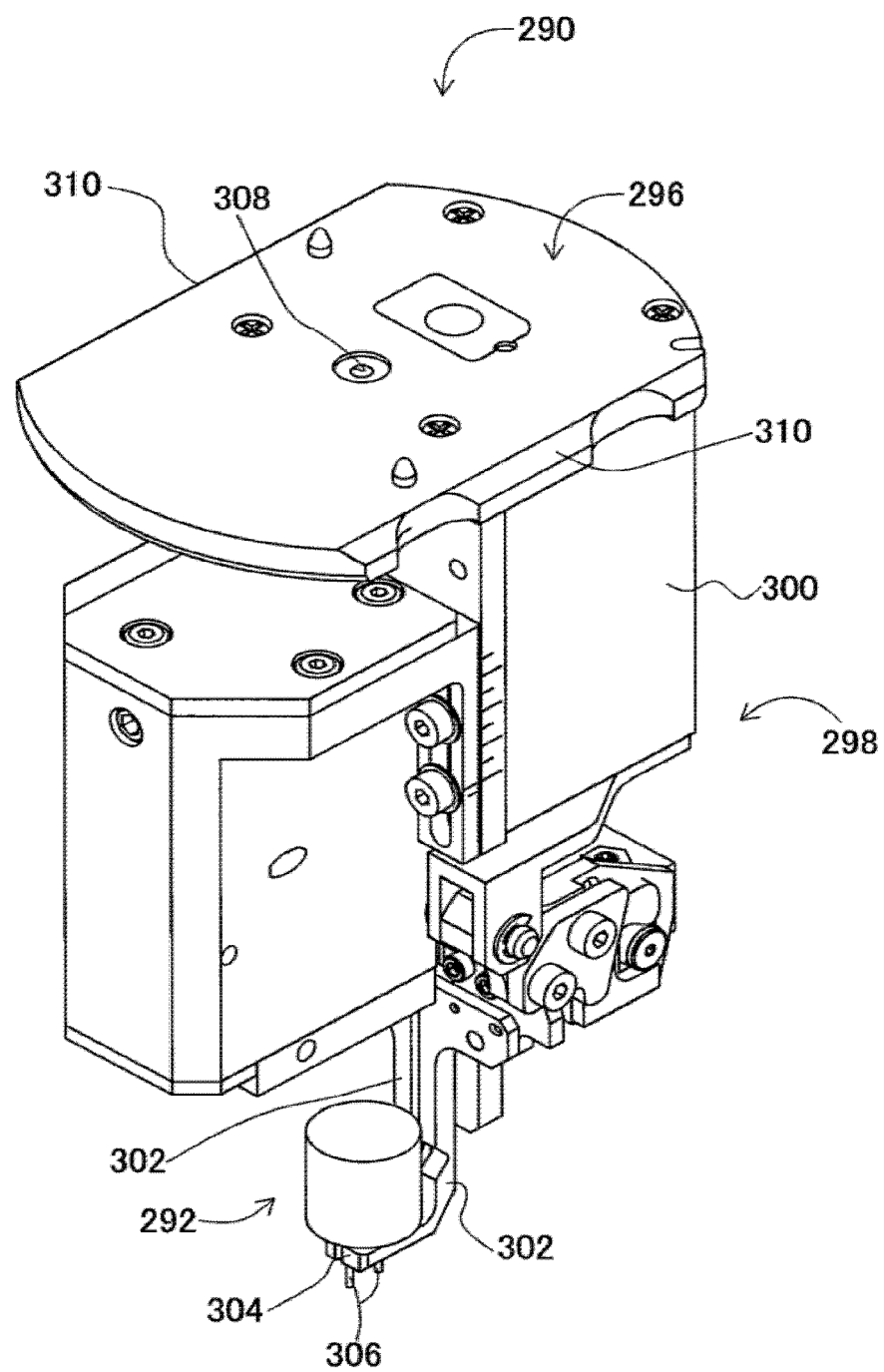
FIG. 18 is a perspective view showing the component holding tool.

In addition, as described above, gripping claws 200 and 202 are mounted on mounting section 102 of work heads 70 and 72 by inserting connecting sections 208 of gripping claws 200 and 202 into fitting holes 170 and 172 of gripping blocks 130 and 132, but the component holding tool is also mounted by gripping the component holding tool by gripping blocks 130 and 132. Component holding tool 290 grips radial component 292, and as shown in FIGS. 17 and 18, is configured by flange section 296 and holding section main body 298 which is fixed to a lower face of flange section 296. Component holding tool 290 is disclosed in Japanese Patent Application No. 2017-551441, which has been filed by the applicant of the present description, and thus will be described briefly.

Holding section main body 298 includes main body section 300, pair of claw sections 302, and auxiliary plate 304. Pair of claw sections 302 are swingly held by main body section 300. Auxiliary plate 304 is positioned between pair of claw sections 302 and swings together with pair of claw sections 302. In this case, auxiliary plate 304 enters between pair of lead wires 306 of radial component 292. Further, pair of claw sections 302 approach auxiliary plate 304, so that pair of lead wires 306 are interposed by pair of claw sections 302 and auxiliary plate 304. The air chamber (not illustrated) is formed inside main body section 300, and the piston (not illustrated) is fitted into the air chamber so as to be slidable in the up-down direction. The piston, pair of claw sections 302, and auxiliary plate 304 are connected by a conversion mechanism (not illustrated). The conversion mechanism converts the movement of the piston in the up-down direction into the swing of pair of claw sections 302 and auxiliary plate 304. Further, through hole 308 which penetrates in the up-down direction is formed in flange section 296, and through hole 308 communicates with the air chamber formed in main body section 300 of holding section main body 298. With such a structure, air is supplied to the air chamber via connecting section 208, and pair of claw sections 302 and auxiliary plate 304 swing. A pair of opposing side edges of flange section 296 are generally straight, and pair of gripped sections 310 are formed on the pair of side edges.

Further, as shown in FIG. 12, second placing hole 228 is formed in loading table 220 in addition to first placing hole 222. The inner dimension of second placing hole 228 is larger than the outer dimension of holding section main body 298 of component holding tool 290 in the circumferential direction, and is smaller than the outer dimension of flange section 296 in the circumferential direction. Therefore, component holding tool 290 is loaded on loading table 220 in a state in which holding section main body 298 is inserted into second placing hole 228 and flange section 296 is latched on the edge portion which defines second placing hole 228.

Further, work heads 70 and 72 are moved above loading table 220 by the operation of work head moving device 76 and are lowered. Before work heads 70 and 72 are lowered, the distance between pair of gripping blocks 130 and 132 is made longer than the distance between pair of gripped sections 310 of flange section 296 of component holding tool 290 by the operation of driving mechanism 104. Then, work heads 70 and 72 are lowered such that flange section 296 of component holding tool 290 loaded on loading table 220 enters between pair of gripping blocks 130 and 132. Flange section 296 enters between pair of gripping blocks 130 and 132 such that pair of gripped sections 310 formed on flange section 296 face pair of gripping blocks 130 and 132.

Figure 19:
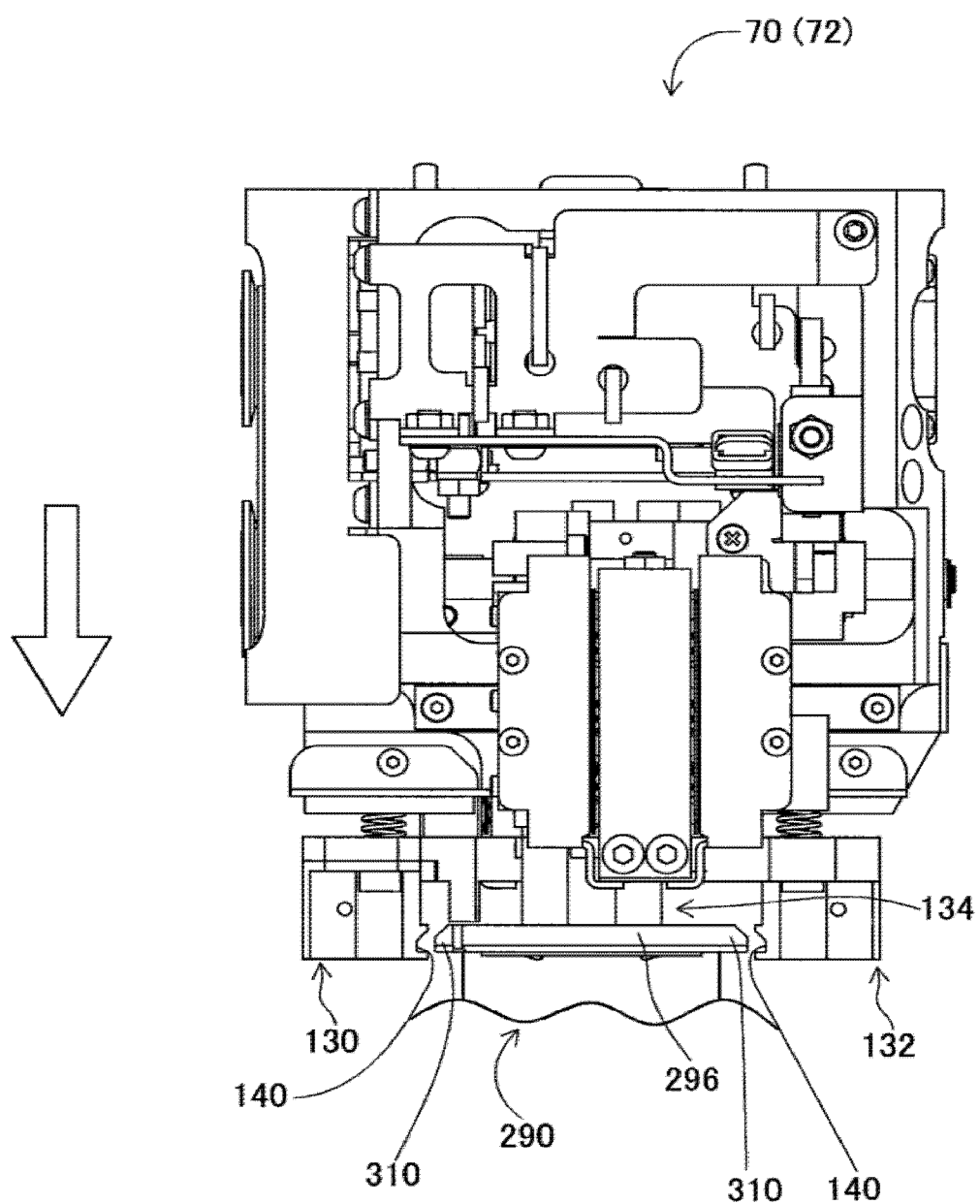
FIG. 19 is a view showing a case in which the component holding tool is mounted on the work head.
Figure 20:
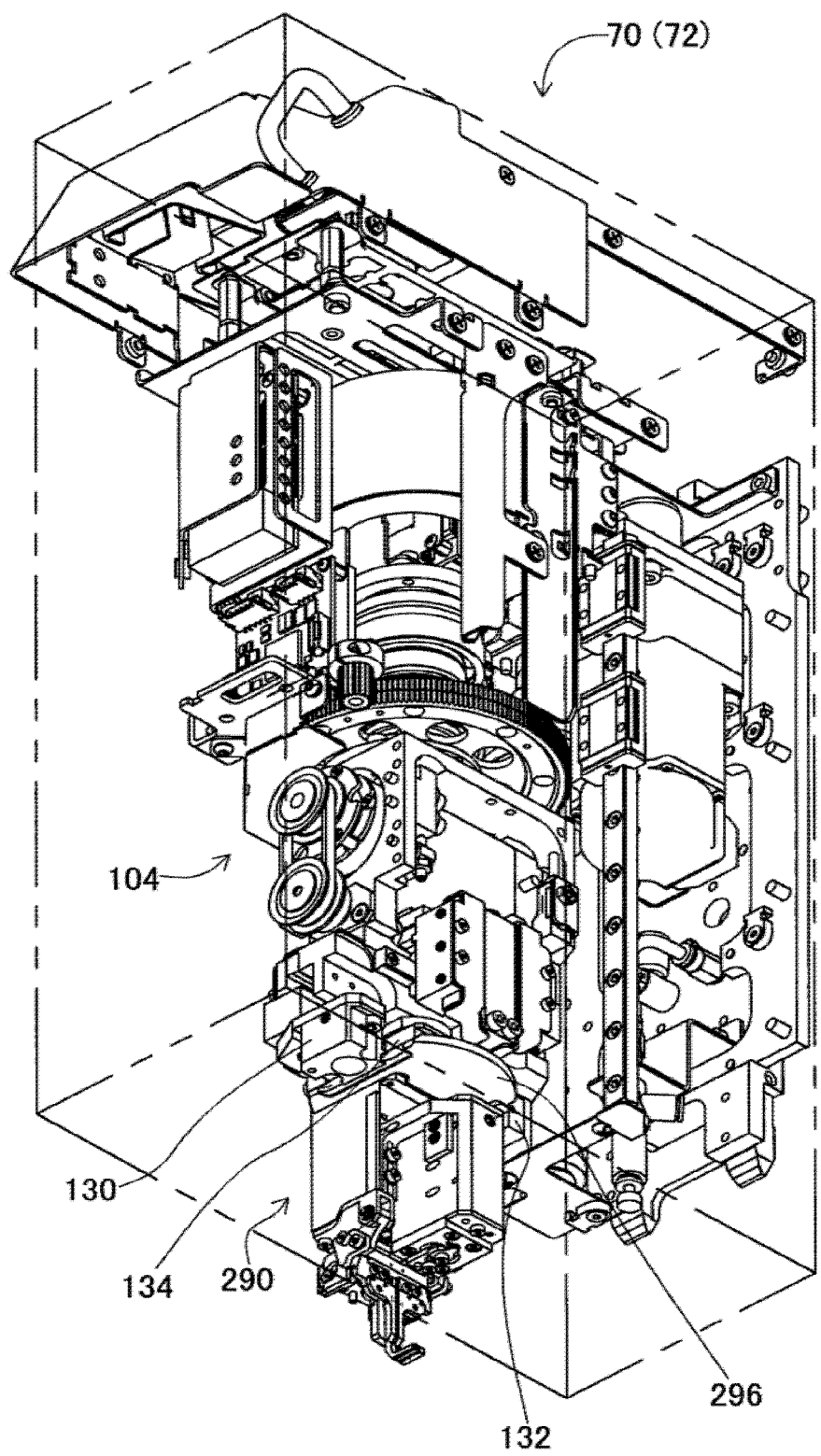
FIG. 20 is a perspective view showing the work head in a state in which the component holding tool is mounted.

In this case, the lower face of connecting block 134 contacts the upper face of flange section 296 entering between pair of gripping blocks 130 and 132. As work heads 70 and 72 are lowered, connecting block 134 rises by being pressed upward by flange section 296 as shown in FIG. 19. As a result, through hole 308 open on the upper face of flange section 296 communicates with air supply pipe 162 in a state in which through hole 308 is in close contact with air supply pipe 162 inside fitting hole 160 of connecting block 134. In a state in which through hole 308 communicates with air supply pipe 162, gripped section 310 of flange section 296 and gripping grooves 140 of gripping blocks 130 and 132 are positioned at the same height. Then, by the driving of driving mechanism 104, pair of gripping blocks 130 and 132 approach each other, so that pair of gripped sections 310 are interposed by pair of gripping grooves 140. As a result, as shown in FIG. 20, component holding tool 290 is gripped by gripping blocks 130 and 132 at flange section 296. That is, flange section 296 is gripped by gripping blocks 130 and 132 in a state in which air supply pipe 162 communicates with through hole 308 of component holding tool 290, so that component holding tool 290 is mounted on mounting section 102 of work heads 70 and 72.

As described above, by mounting component holding tool 290 on mounting section 102, the mounting work of radial component 292 is performed by work heads 70 and 72. That is, for example, by the supply of the positive pressure to air supply pipe 162, lead wire 306 swings toward the space between pair of lead wires 306 of radial component 292, and pair of claw sections 302 swing in a direction approaching auxiliary plate 304. As a result, pair of lead wires 306 are interposed by pair of claw sections 302 and auxiliary plate 304. Lead wire 306 interposed by claw sections 302 and auxiliary plate 304 is inserted into the through hole (not illustrated) formed in circuit substrate 12. Next, in a case in which lead wire 306 is inserted into the through hole, by the supply of a negative pressure to air supply pipe 162, lead wire 306 swings in a direction of being pulled out from between pair of lead wires 306, and pair of claw sections 302 swings in a direction of being separated from auxiliary plate 304. As a result, radial component 292 is separated from component holding tool 290 and mounted on circuit substrate 12.

Then, in a case in which the mounting work of radial component 292 by component holding tool 290 is completed, component holding tool 290 is returned to loading table 220. Specifically, by the operation of work head moving device 76, work heads 70 and 72 are moved above loading table 220, and work heads 70 and 72 are lowered such that holding section main body 298 of component holding tool 290 is inserted into second placing hole 228. Then, pair of gripping blocks 130 and 132 are separated from each other by the driving of driving mechanism 104, the gripping of component holding tool 290 by gripping blocks 130 and 132 is released, and component holding tool 290 is separated from gripping blocks 130 and 132. In addition, as component holding tool 290 is separated from gripping blocks 130 and 132, component holding tool 290 is also separated from connecting block 134. As a result, component holding tool 290 is returned to loading table 220. As described above, component holding tool 290 is also automatically mounted on and separated from gripping blocks 130 and 132 and connecting block 134.

Figure 21:
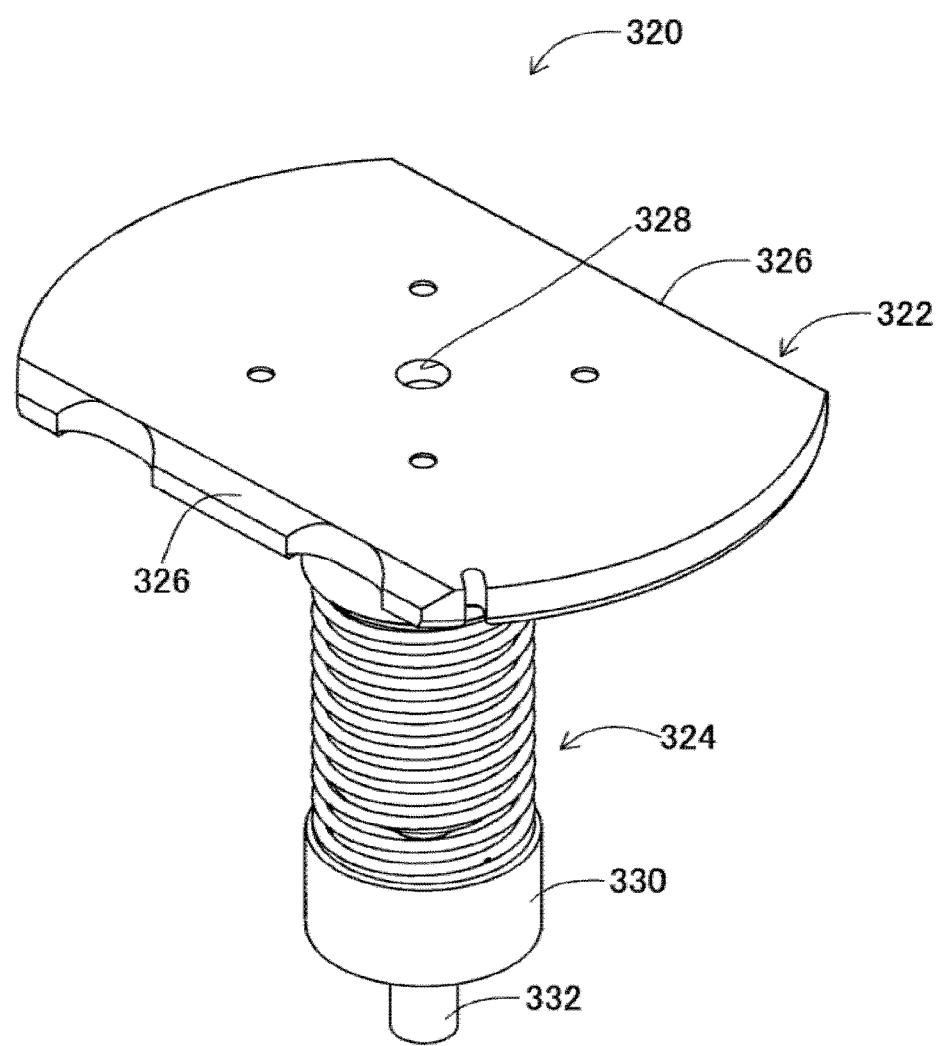
FIG. 21 is a perspective view showing a suction nozzle.

In addition, suction nozzle 320 shown in FIG. 21 can also be mounted on mounting section 102. Suction nozzle 320 is configured by flange section 322 and nozzle main body 324 fixed to the lower face of flange section 322. Flange section 322 has the same shape as flange section 296 of component holding tool 290, and similarly to flange section 296, pair of gripped sections 326 are formed on a pair of opposing side edges of flange section 322, and through hole 328 which penetrates flange section 322 in the up-down direction is formed. Nozzle main body 324 includes main body section 330 which has a generally cylindrical shape, and suction pipe 332 through which main body section 330 is inserted in the up-down direction. The upper end of suction pipe 332 communicates with the lower end of through hole 328 formed in flange section 322.

Figure 22:
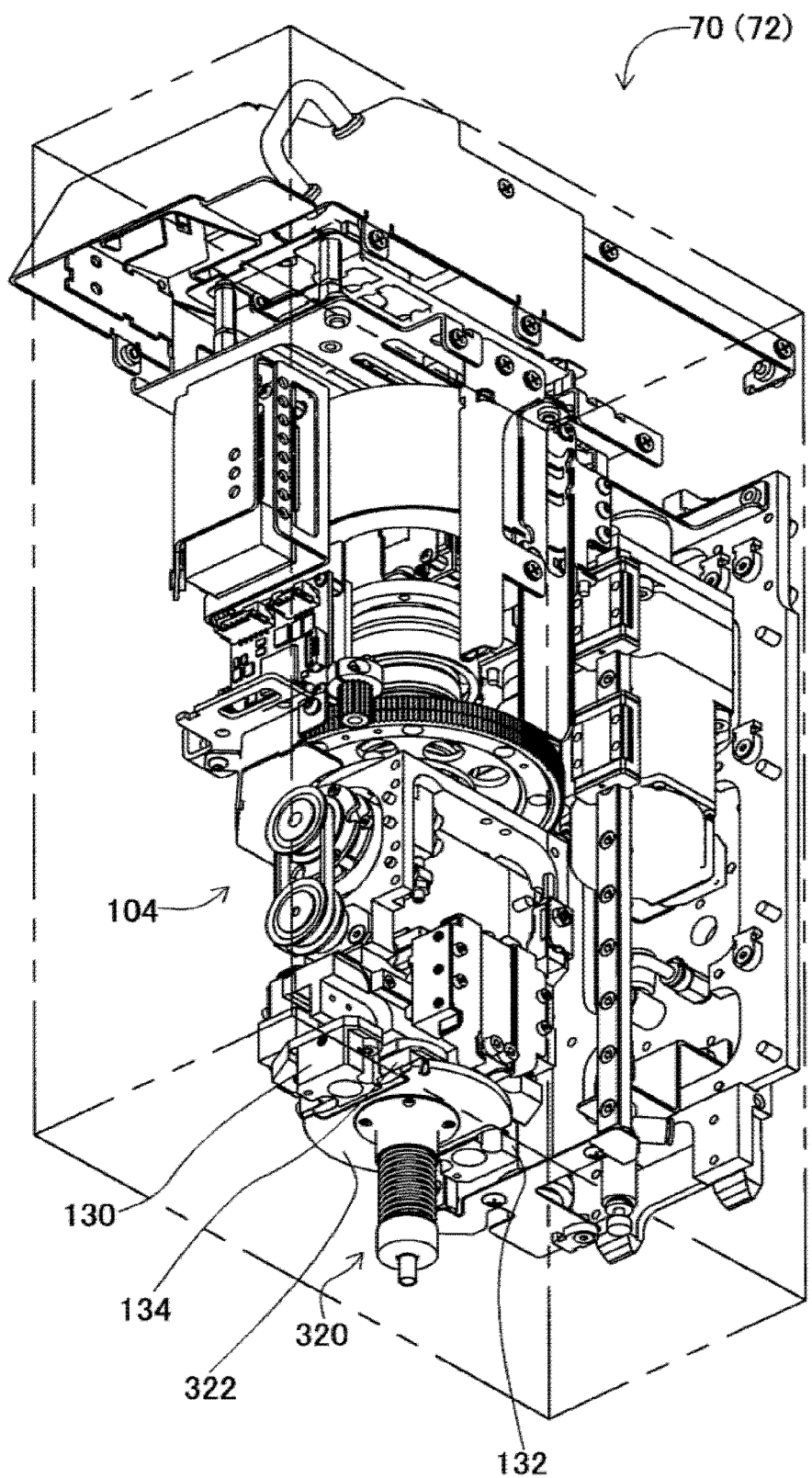
FIG. 22 is a perspective view showing the work head in a state in which the suction nozzle is mounted.

Suction nozzle 320 which has such a structure is also mounted on work heads 70 and 72 in the same manner as component holding tool 290. That is, in a state in which air supply pipe 162 communicates with through hole 328 of suction nozzle 320, pair of gripped sections 326 of flange section 322 are interposed by gripping grooves 140 of pair of gripping blocks 130 and 132. As a result, as shown in FIG. 22, component holding tool 290 is mounted on mounting section 102 of work heads 70 and 72. Then, the mounting work of the component is performed by work heads 70 and 72. That is, by the supply of the negative pressure to air supply pipe 162, the component is picked up and held at a tip end of suction pipe 332. Then, in a state in which the component is loaded on the predetermined position of circuit substrate 12, by the supply of the positive pressure to air supply pipe 162, the component is separated from the tip end of suction pipe 332 and the component is mounted on circuit substrate 12.

Then, in a case in which the mounting work by suction nozzle 320 is completed, suction nozzle 320 is returned to loading table 220. A method of returning suction nozzle 320 to loading table 220 is the same as a method of returning component holding tool 290 to loading table 220. That is, by the driving of driving mechanism 104, pair of gripping blocks 130 and 132 are separated from each other, so that suction nozzle 320 is separated from gripping blocks 130 and 132 and connecting block 134, and is returned to loading table 220. As described above, suction nozzle 320 is also automatically mounted on and separated from gripping blocks 130 and 132 and connecting block 134.

As described above, on mounting section 102 of work heads 70 and 72, any of the four types of holding tools of gripping claws 200 and 202, pusher 240 and gripping claws 260 and 262, component holding tool 290, and suction nozzle 320, which hold the component, is mounted. As a result, the mounting works of various components can be performed in component mounting machine 10.

In particular, in gripping claws 200, 202, 260, and 262, and pusher 240, connecting section 208, 248, and 268 have the same shape, and are mounted on mounting section 102 by being inserted into fitting holes 160, 170, and 172 of gripping blocks 130 and 132 and connecting block 134. On the other hand, in component holding tool 290 and suction nozzle 320, flange sections 296 and 322 have the same shape, and are mounted on mounting section 102 by being gripped by pair of gripping blocks 130 and 132. That is, in work heads 70 and 72, various holding tools are mounted on mounting section 102 by two different methods of insertion of connecting section 208, 248, and 268 into fitting holes 160, 170, and 172, and gripping of flange section 296 by gripping blocks 130 and 132. As a result, it is possible to mount the holding tools having significantly different structures, such as gripping claws 200, 202, 260, and 262 having connecting sections 208, 248, and 268, and component holding tool 290 having flange sections 296 and 322, on mounting section 102 of work heads 70 and 72.

The four types of holding tools are automatically mounted on and separated from mounting section 102 on loading table 220. As a result, the burden on the operator is reduced. Furthermore, the rotation of first shaft 110 of driving mechanism 104 is inhibited by brake pad 128 during a power failure or the like. Therefore, the positions of pair of gripping blocks 130 and 132 are maintained during a power failure or the like. That is, in a case in which gripping claws 200, 202, 260, and 262 are mounted on gripping blocks 130 and 132, the components gripped by gripping claws 200, 202, 260, and 262 are maintained in the gripped state even during a power failure. In addition, in a case in which component holding tool 290 or suction nozzle 320 is gripped by gripping blocks 130 and 132, component holding tool 290 or suction nozzle 320 gripped by gripping blocks 130 and 132 is maintained in the gripped state even during a power failure. As a result, it is possible to prevent the component from falling off or component holding tool 290 or suction nozzle 320 from falling off during a power failure.

Figure 23:
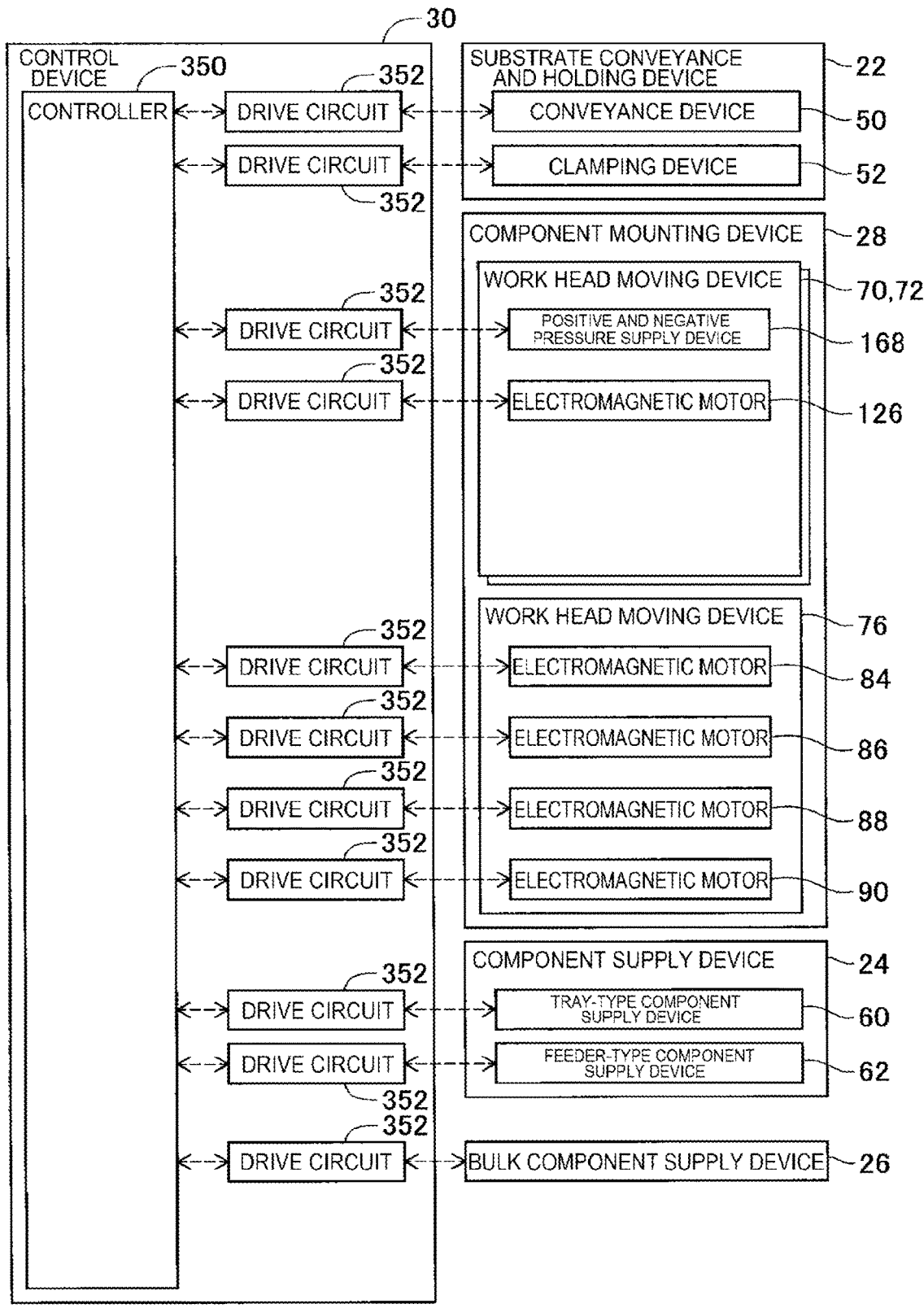
FIG. 23 is a block diagram showing a control device.

Control device 30 that controls the operations of work heads 70 and 72, work head moving device 76, and the like includes controller 350 and multiple drive circuits 352, as shown in FIG. 23. Multiple drive circuits 352 are connected to conveyance device 50, clamping device 52, electromagnetic motors 84, 86, 88, 90, and 126, positive and negative pressure supply device 168, tray-type component supply device 60, feeder-type component supply device 62, and bulk component supply device 26. Controller 350 includes CPU, ROM, RAM, and the like, which is mainly a computer, and is connected to multiple drive circuits 352. As a result, the operations of substrate conveyance and holding device 22, component supply device 24, and the like are controlled by controller 350.

Component mounting machine 10 in the above embodiment is an example of a work machine. Control device 30 is an example of a control device. Work heads 70 and 72 are examples of a work head. Work head moving device 76 is an example of a moving device. Head main body 100 is an example of a head main body. Gripping blocks 130 and 132 are examples of a movable body. Air supply pipe 162 is an example of an air passage. Fixing mechanisms 174 and 176 are examples of a fixing mechanism. Engaging body 178 is an example of an engaging body. Gripping claws 200 and 202 are examples of a claw. Loading table 220 is an example of an accommodation section. Protruding section 224 is an example of an abutting section. Fixing mechanism 230 is an example of a connecting mechanism. Pusher 240 is an example of a pusher. Gripping claws 260 and 262 are examples of a claw. Component holding tool 290 is an example of a holding tool. Suction nozzle 320 is another example of the holding tool.

The present disclosure is not limited to the embodiment described above, and can be implemented in various embodiments with various modifications and improvements based on the knowledge of those skilled in the art. Specifically, for example, in the above embodiment, pusher 240 is mounted in fitting hole 160 of connecting block 134, but a work tool that performs the operation different from pusher 240 may be mounted in fitting hole 160. For example, a work tool that blows air from the work tool by supply of air from air supply pipe 162 to perform cleaning or the like may be mounted in fitting hole 160.

In the above embodiment, air supply pipe 162 is disposed only in fitting hole 160 of connecting block 134, but air supply pipe 162 may be disposed in fitting holes 170 and 172 of gripping blocks 130 and 132. In such a case, by forming the through hole, which has the same shape as through hole 252 formed in pusher 240, in connecting section 208 and 268 of gripping claws 200, 202, 260, and 262, air can be ejected from gripping claws 200, 202, 260, and 262.

In fixing mechanisms 174 and 176, engaging body 178 slides to engage with connecting sections 208 and 268 of gripping claws 200, 202, 260, and 262, but engaging body 178 may be moved in various manners such as swinging, pivoting, and rotating to engage with connecting sections 208 and 268 of gripping claws 200, 202, 260, and 262.

REFERENCE SIGNS LIST

10: component mounting machine (work machine), 30: control device, 70: work head, 72: work head, 76: work head moving device (moving device), 100: head main body, 130: gripping block (movable body), 132: gripping block (movable body), 162: air supply pipe (air passage), 174: fixing mechanism, 176: fixing mechanism, 178: engaging body, 200: gripping claw (claw), 202: gripping claw (claw), 220: loading table (accommodation section), 224: protruding section (abutting section), 230: fixing mechanism (connecting mechanism), 240: pusher, 260: gripping claw (claw), 262: gripping claw (claw), 290: component holding tool (holding tool), 320: suction nozzle (holding tool)

The invention claimed is:

1. A work head comprising:
a head main body;
multiple movable bodies held by the head main body and configured to be approachable to and separatable from each other, the movable bodies configured to detachably grip a holding tool configured to mount a tool configured to hold a component;
an air passage formed, being open between the multiple movable bodies, in the head main body; and
wherein the work head grips a flange of the tool, by causing the multiple movable bodies to approach the tool so that the tool is attached to the work head and configured to hold the component.

2. The work head according to claim 1, wherein the tool is two or more claws and a flange of the two or more claws is gripped by grooves formed on opposing side faces of the movable bodies, the component being gripped by the two or more claws held by the movable bodies.

3. The work head according to claim 2, wherein a pusher is connected to the air passage via a connecting mechanism in a state in which the two or more claws are fixed to the movable bodies, and the component gripped by the two or more claws is pressed by the pusher by supply of air to via the air passage.

4. A work machine comprising:
a work head,
a head main body,
multiple movable bodies held by the head main body and configured to be approachable to and separatable from each other, the movable bodies configured to grip a holding tool configured to mount a tool configured to hold a component, and
an air passage formed, being open between the multiple movable bodies, in the head main body;
a moving device configured to move the work head;
a control device configured to control operation of the moving device; and
an accommodation section configured to accommodate the tool,
wherein the movable bodies include fixing mechanism includes an engaging body configured to move between an engaging position with the tool and a disengaging position from the tool, and is configured to fix the tool by engagement of the engaging body with the tool and separate the tool by disengagement, and
by controlling the operation of the moving device by the control device such that the engaging body abuts on an abutting section formed in the accommodation section in a state in which the tool are fixed to the movable bodies, the engaging body is moved from the engaging position with the tool to the disengaging position from the tool, the tool are separated from the movable bodies, and the tool are accommodated in the accommodation section.

5. The work head according to claim 1, wherein the tool is a nozzle and a flange of the nozzle is gripped by grooves formed on opposing side faces of the movable bodies, the component being held by the nozzle via air supplied to the nozzle by the air passage.

* * * * *